US012550624B2

(12) United States Patent
Chu et al.

(10) Patent No.: US 12,550,624 B2
(45) Date of Patent: Feb. 10, 2026

(54) SEMICONDUCTOR MEMORY DEVICE AND METHOD OF FORMING THE SAME

(71) Applicant: Taiwan Semiconductor Manufacturing Company, Ltd., Hsin-Chu (TW)

(72) Inventors: Yi-Cheng Chu, Hsinchu (TW); Chung-Te Lin, Tainan (TW); Kai-Wen Cheng, Taichung (TW); Han-Ting Tsai, Hsinchu (TW); Jung-Tsan Tsai, New Taipei (TW); Pao-Yi Tai, Miaoli County (TW); Chien-Hua Huang, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 717 days.

(21) Appl. No.: 17/726,175

(22) Filed: Apr. 21, 2022

(65) Prior Publication Data

US 2022/0406992 A1    Dec. 22, 2022

Related U.S. Application Data

(60) Provisional application No. 63/211,627, filed on Jun. 17, 2021.

(51) Int. Cl.
*H10N 50/80*      (2023.01)
*H10B 61/00*      (2023.01)
*H10N 50/01*      (2023.01)

(52) U.S. Cl.
CPC .............. *H10N 50/80* (2023.02); *H10B 61/22* (2023.02); *H10N 50/01* (2023.02)

(58) Field of Classification Search
USPC .......................................................... 257/421
See application file for complete search history.

(56) References Cited

U.S. PATENT DOCUMENTS

| | | | |
|---|---|---|---|
| 6,355,983 B2 * | 3/2002 | Graas | ................ H01L 21/76885 257/E23.137 |
| 10,522,749 B2 | 12/2019 | Shen | |
| 10,630,296 B2 | 4/2020 | Lee et al. | |
| 2012/0024365 A1 * | 2/2012 | Branz | ................. F24D 11/0221 136/256 |
| 2017/0301728 A1 * | 10/2017 | Chuang | ................. H10N 50/80 |

(Continued)

FOREIGN PATENT DOCUMENTS

| | | |
|---|---|---|
| TW | 200952226 A | 12/2009 |
| TW | 201001767 A | 1/2010 |

(Continued)

*Primary Examiner* — Bo B Jang
(74) *Attorney, Agent, or Firm* — HAYNES AND BOONE, LLP

(57) ABSTRACT

Some embodiments relate to a memory device. The memory device includes a substrate comprising an inter-metal dielectric layer having a metal line, a dielectric layer over the substrate, a bottom electrode via through the dielectric layer and in contact with the metal line, a bottom electrode over the bottom electrode via, a magnetic tunneling junction (MTJ) element over the bottom electrode, and a top electrode over the MTJ element. A center portion of the bottom electrode directly above the bottom electrode via is thicker than an edge portion of the bottom electrode.

20 Claims, 24 Drawing Sheets

(56) References Cited

U.S. PATENT DOCUMENTS

| | | |
|---|---|---|
| 2019/0259808 A1 | 8/2019 | Jacob et al. |
| 2020/0395535 A1 | 12/2020 | Liao et al. |
| 2021/0057639 A1 | 2/2021 | Ku et al. |
| 2021/0098248 A1 | 4/2021 | Wu et al. |
| 2021/0098685 A1 | 4/2021 | Liou et al. |
| 2021/0098695 A1 | 4/2021 | Peng et al. |
| 2021/0175412 A1 | 6/2021 | Chern |

FOREIGN PATENT DOCUMENTS

| | | |
|---|---|---|
| TW | 201937688 A | 9/2019 |
| TW | 202032782 A | 9/2020 |
| TW | 202036890 A | 10/2020 |
| TW | 202123500 A | 6/2021 |

\* cited by examiner

SEMICONDUCTOR MEMORY DEVICE AND METHOD OF FORMING THE SAME

PRIORITY

This application claims the benefits to U.S. Provisional Application No. 63/211,627, filed Jun. 17, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and particularly magnetic random-access memory (MRAM). In some implementations, MRAM can offer comparable performance to volatile static random-access memory (SRAM) and comparable density with lower power consumption than volatile dynamic random-access memory (DRAM). Compared to NVM Flash memory, MRAM may offer faster access and suffer less degradation over time. An MRAM cell is formed by a magnetic tunneling junction (MTJ) comprising multiple films, including two ferromagnetic layers separated by a thin insulating barrier layer, which operate by tunneling of electrons between the two ferromagnetic layers through the insulating barrier layer. The films of an MTJ need to keep flat to ensure MRAM performance, but metal vias under the films may cause films waving and deteriorate MRAM performance. Therefore, although existing approaches in MRAM device formation have generally been adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
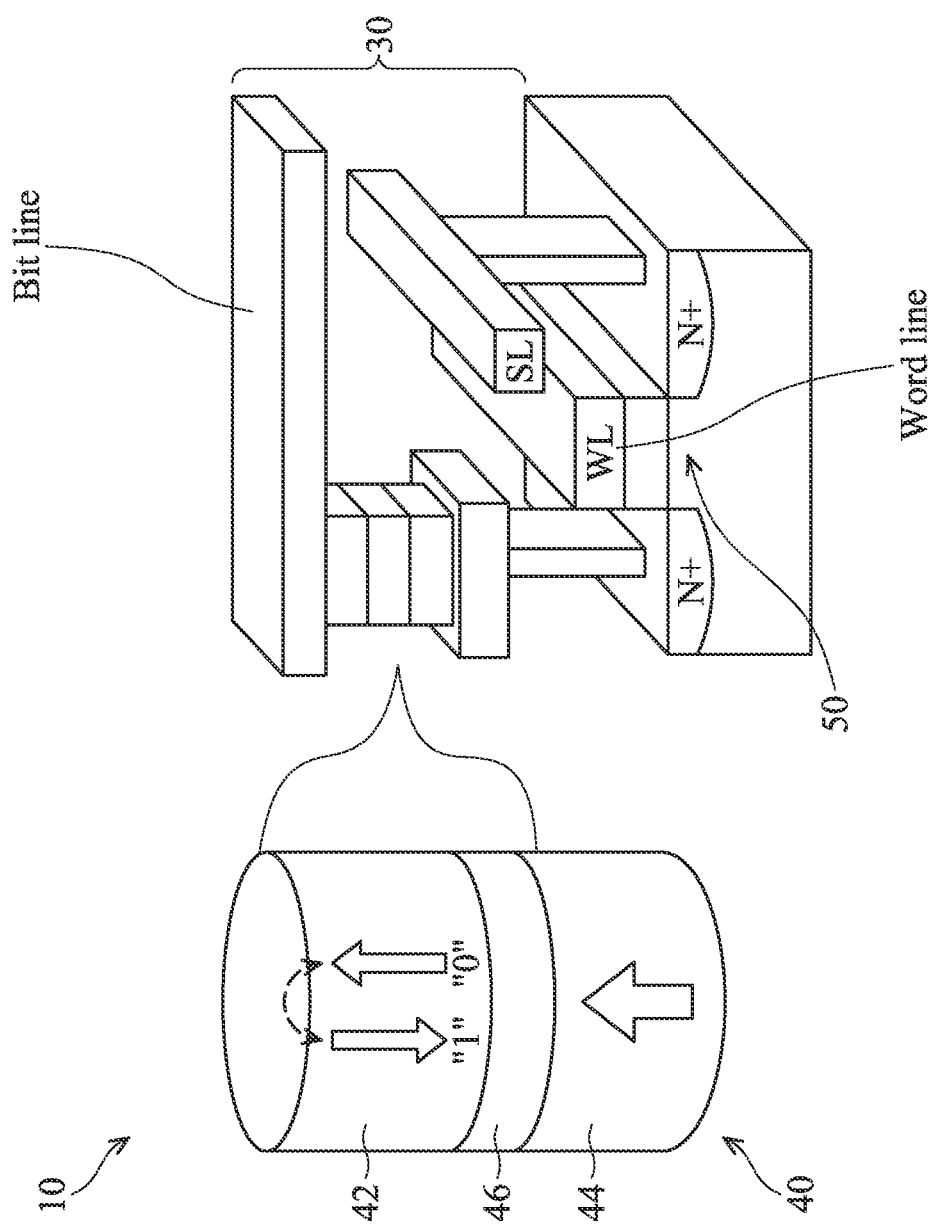
FIGS. 1A and 1B illustrate perspective views of a semiconductor device with MRAM cells integrated therein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with an array of magnetic random-access memory (MRAM) devices (or cells) where the bottom electrode via (BEVA) under a magnetic tunneling junction (MTJ) are formed with a concave top surface. The concave top surface causes the bottom electrode deposited thereon have a thicker portion right above the BEVA than other portions. The thicker portion of the bottom electrode increases process window to ensure a flat top surface of the bottom electrode, which reduces risks of forming wavy layers (films) of an MTJ.

In some embodiments, the MRAM devices are provided in a memory device region (or MRAM region) of the semiconductor device and logic devices are provided in a logic device region (or logic region) of the semiconductor device. The memory device region may include an array of MRAM devices arranged into row and columns. The MRAM devices in the same row are connected to a common word line, and the MRAM devices in the same column are connected to a common bit line. The array may be connected to and controlled by the logic devices in the logic region.

The MRAM devices of the present disclosure may be formed over a semiconductor structure that includes a semiconductor substrate. Upon the semiconductor substrate certain devices may be formed such as field effect transistors (FET) having the associated gate, source, and drain features. Also disposed on the semiconductor structure may be one or more layers of a multi-layer interconnect (or MLI) that includes horizontally extending conductive lines (e.g., metallization layers) and vertically extending conductive vias. The MLI may interconnect one or more of the devices (e.g., FETs) formed on the substrate. In an embodiment, at least one metallization layer of the MLI is formed on the semiconductor structure, while other metallization layers of the MLI may be formed after (e.g., above) the MRAM device fabricated as discussed below. In other words, the MRAM device is disposed within a metallization layer of the MLI.

Figure 1B:
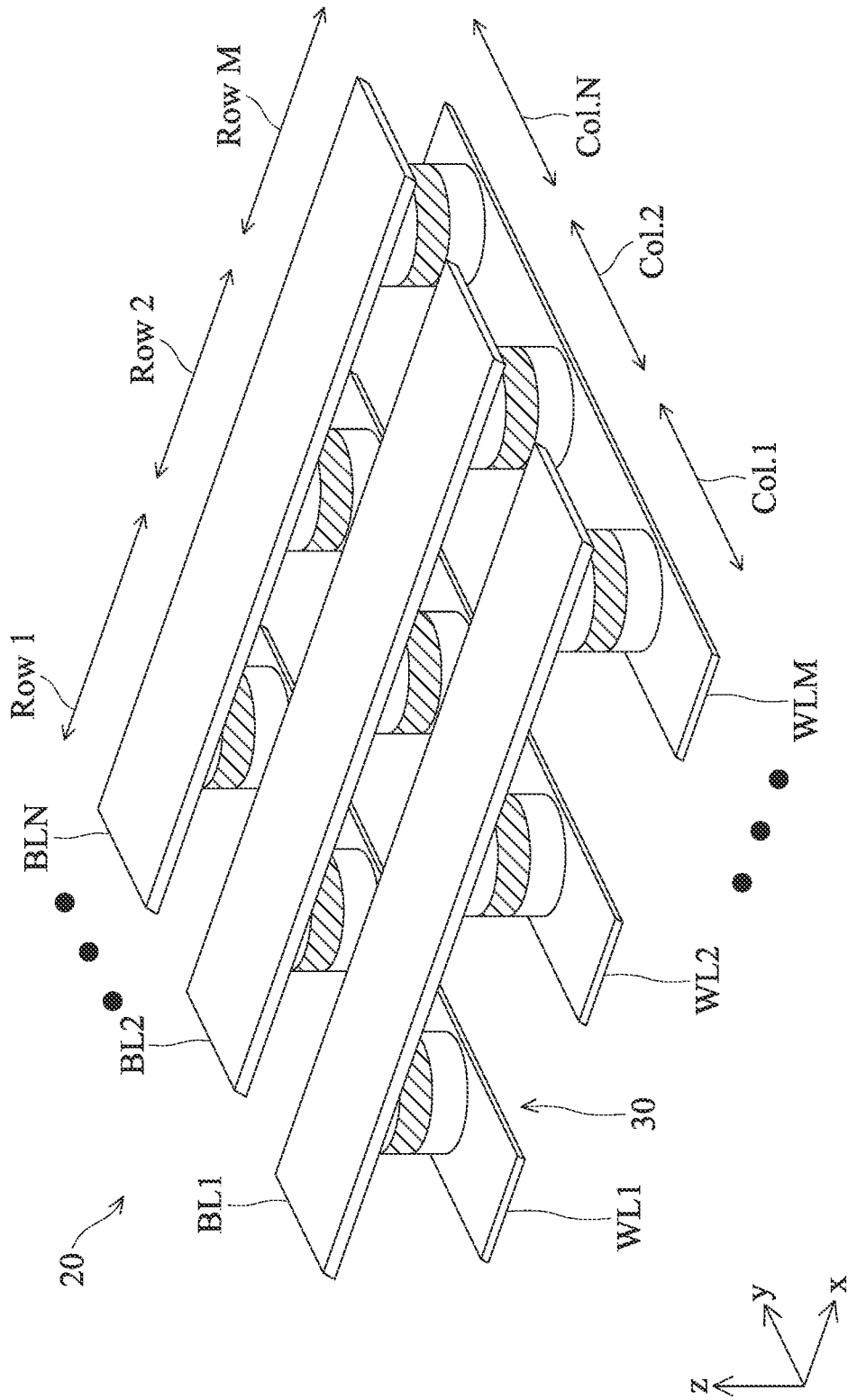

FIGS. 1A and 1B illustrate perspective views of a semiconductor device 10 having an MRAM array 20. Particularly, FIG. 1A illustrates a building block of the MRAM array 20—an MRAM cell 30 having an MTJ 40 (or MTJ stack 40). The MTJ 40 includes an upper magnetic plate 42 (or top magnetic plate) and a lower magnetic plate 44 (or bottom magnetic plate), which are separated by a thin insulating layer 46, also referred to as a tunnel barrier layer. One of the two magnetic plates (e.g., the lower magnetic plate 44) includes a magnetic layer that is pinned (thus referred to as a pinned layer or a reference layer) to an antiferromagnetic layer (referred to as a pinning layer), while the other magnetic plate (e.g., the upper magnetic plate 42) is a "free" magnetic layer (also referred to as a free layer) that can have its magnetic field changed to one of two or more values to store one of two or more corresponding data states. FIG. 1B illustrates an MRAM array 20, which includes M rows (words) and N columns (bits) of MRAM cells 30. Each MRAM cell 30 comprises an MTJ 40. Word lines $WL_1, WL_2, \ldots WL_M$ extend across respective rows of MRAM cells 30 and bit lines $BL_1, BL_2, \ldots BL_N$ extend along columns of MRAM cells 30.

The MTJ 40 uses tunnel magnetoresistance (TMR) to store magnetic fields on the upper and lower magnetic plates 42 and 44. For a sufficiently thin insulating layer 46 (e.g., about 10 nm or less thick), electrons can tunnel from the upper magnetic plate 42 to the lower magnetic plate 44. Data may be written to the cell in many ways. In one method, current is passed between the upper and lower magnetic plates 42 and 44, which induces a magnetic field stored in the free layer (e.g., the upper magnetic plate 42). In another method, spin-transfer-torque (STT) is utilized, wherein a spin-aligned or polarized electron flow is used to change the magnetic field within the free layer with respect to the reference layer. Other methods to write data may be used. However, all data write methods include changing the magnetic field within the free layer with respect to the reference layer.

The electrical resistance of the MTJ 40 changes in accordance with the magnetic fields stored in the upper and lower magnetic plates 42 and 44, due to the magnetic tunnel effect. For example, when the magnetic fields of the upper and lower magnetic plates 42 and 44 are aligned (or in the same direction), the MTJ 40 is in a low-resistance state (i.e., a logical "0" state). When the magnetic fields of the upper and lower magnetic plates 42 and 44 are in opposite directions, the MTJ 40 is in a high-resistance state (i.e., a logical "1" state). The direction of the magnetic field of the upper magnetic plate 42 can be changed by passing a current through the MTJ 40. By measuring the electrical resistance between the upper and lower magnetic plates 42 and 44, a read circuitry coupled to the MTJ 40 can discern between the "0" and "1" states. FIG. 1A further shows that the upper magnetic plate 42 of an MTJ 40 is coupled to a bit line, the lower magnetic plate 44 of an MTJ 40 is coupled to a source (or drain) of a transistor in a transistor structure 50, the drain (or source) of the transistor is coupled to a select line (SL), and the gate of the transistor is coupled to a word line (WL). The MTJ 40 can be accessed (such as read or written) through the bit line, word line, and the select line. Since the MTJ 40 utilizes magnetization to store binary digitized information, there is a risk that metal particles as byproducts during the patterning of the MTJ stacks may be redeposited on sidewalls of the MTJ 40 shorting the upper magnetic plate 42 and the lower magnetic plate 44. An object of the present disclosure is to provide structures and method thereof that can protect the MTJ 40 from high risks of redeposited material on its sidewalls.

Figure 2:
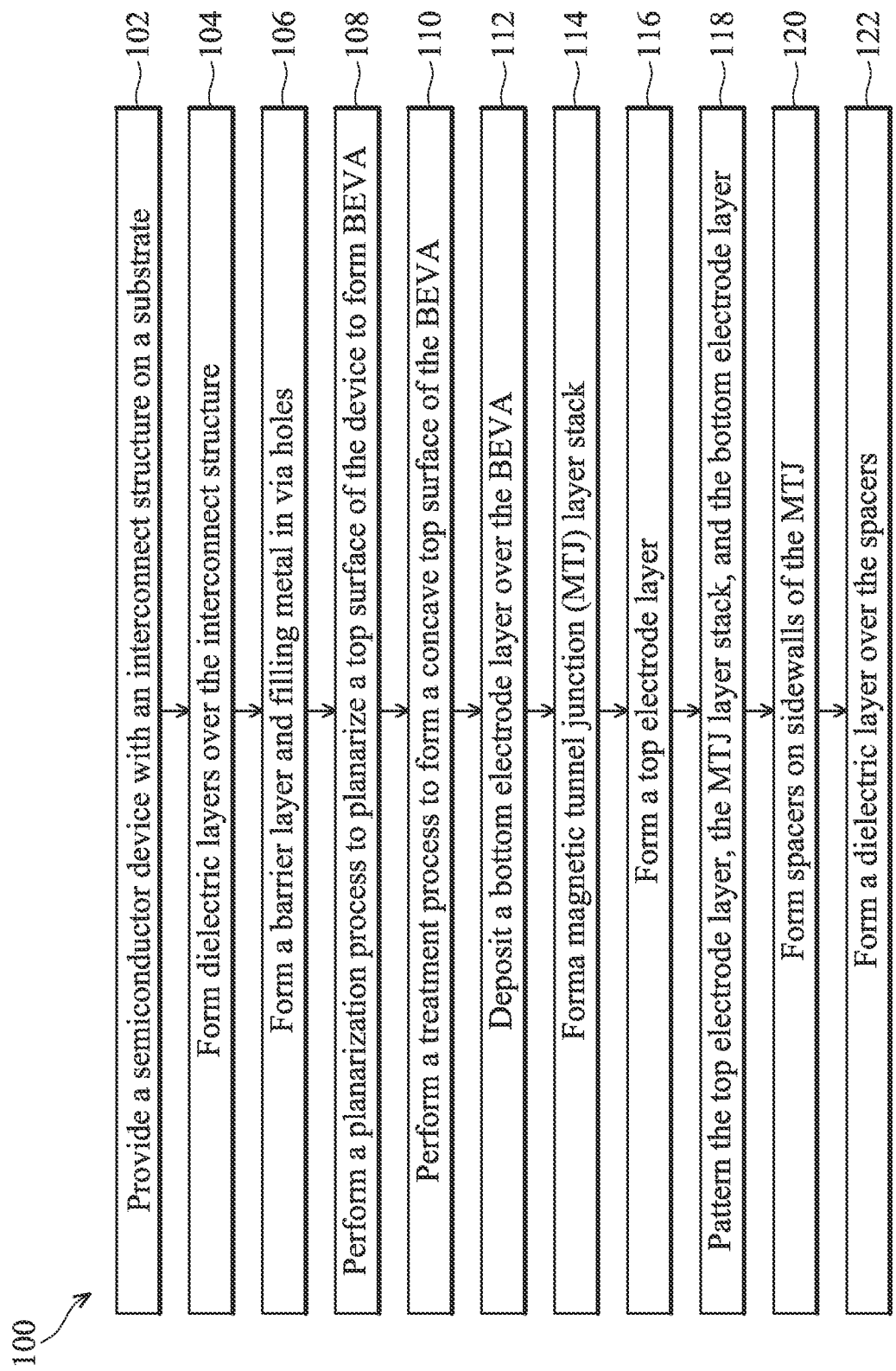
FIG. 2 shows a flow chart of a method for forming a semiconductor device with MRAM cells integrated therein, according to an embodiment of the present disclosure.

FIG. 2 illustrates a flow chart of a method 100 for forming the semiconductor device 200 having an MRAM array and logic devices integrated in accordance with an embodiment. Many aspects of the semiconductor device 200 are the same as or similar to those of the semiconductor device 10 illustrated in FIGS. 1A and 1B. The semiconductor device 200 is provided for illustration purposes and does not necessarily limit the embodiments of the present disclosure to any number of devices, any number of regions, or any configuration of structures or regions. Furthermore, the semiconductor device 200 may be an intermediate device fabricated during processing of an integrated circuit (IC). The method 100 is merely an example, not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIG. 3 through FIG. 23, which illustrate various cross-sectional views of the semiconductor device 200 during fabrication steps according to the method 100.

Figure 3:
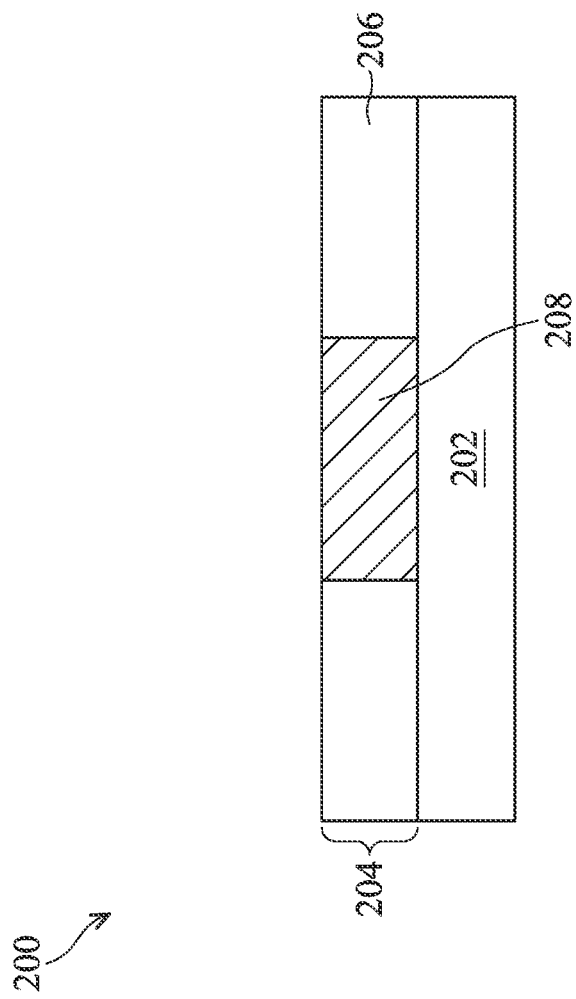
FIGS. 3, 4, 5, 6, 7, 8, 9, 10, 11, 12, 13, 14, 15, 16, 17, 18, 19, 20, 21, and 22 illustrate cross-sectional views of a semiconductor structure during a fabrication process according to the method of FIG. 2, in accordance with some embodiments.

At operation 102, the method 100 (FIG. 2) provides, or is provided with, a semiconductor device 200 having a substrate 202, such as shown in FIG. 3. In some embodiments, the semiconductor substrate 202 may be but is not limited to, a silicon substrate (such as a silicon wafer). Alternatively, the semiconductor substrate 202 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 202 is a semiconductor on insulator (SOI). In other alternatives, the semiconductor substrate 202 may include a doped epitaxial layer, a gradient semiconductor layer, and/or a semiconductor layer overlying another semiconductor layer of a different type, such as a silicon layer on a silicon germanium layer. The semiconductor substrate 202 may further include passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. In some embodiments, transistors in the semiconductor substrate 202 can be planar transistors or non-planar transistors, such as FinFETs or gate-all-around (GAA) transistors.

The semiconductor device 200 further includes an interconnect structure 204 having an inter-layer dielectric (ILD) layer or inter-metal dielectric layer (IMD) layer 206 with a metallization pattern 208 (e.g., metal line). The ILD layer

206 may be silicon oxide, fluorinated silica glass (FSG), carbon doped silicon oxide, tetra-ethyl-ortho-silicate (TEOS) formed oxide, phosphosilicate glass (PSG), boro-phosphosilicate glass (BPSG), Black Diamond® (Applied Materials of Santa Clara, Calif.), amorphous fluorinated carbon, low-k dielectric material, the like or combinations thereof. The metallization pattern 208 may be aluminum, aluminum alloy, copper, copper alloy, titanium, titanium nitride, tantalum, tantalum nitride, tungsten, the like, and/or combinations thereof. Formation of the metallization pattern 208 and the ILD layer 206 may be a dual-damascene process and/or a single-damascene process.

Figure 4:
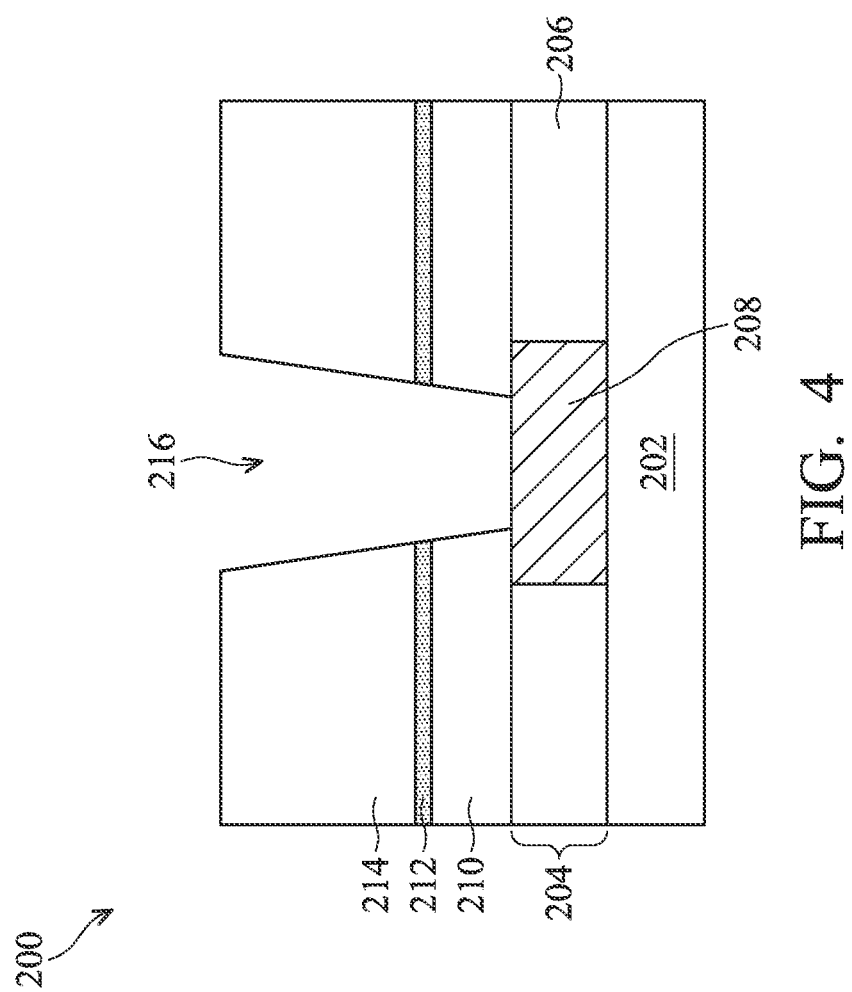

At operation 104, the method 100 (FIG. 2) deposits various dielectric layers 210, 212, and 214 over the interconnect structure 204, such as shown in FIG. 4. In an embodiment, the dielectric layer 210 may include one or more dielectric materials such as $Si_3N_4$, SiON, SiC, SiCN, or a combination thereof, and may be deposited using PVD, CVD, ALD, or other suitable processes to a thickness in a range of about 12 nm to about 20 nm. In an embodiment, the dielectric layer 212 includes a metal-based dielectric material, such as aluminum oxide, and may be deposited using CVD, ALD, or other suitable processes to a thickness in a range of about 2 nm to about 6 nm. In an embodiment, the dielectric layer 214 includes a silicon oxide based dielectric material such as un-doped silicate glass (USG), and may be deposited using CVD, PVD, or other suitable processes to a thickness in a range of about 40 nm to about 100 nm. A via hole 216 is formed into the dielectric layers 214, 212, and 210 to expose a top surface of the metallization pattern 208. The via hole 216 may be formed using a variety of processes including photolithography processes and etching processes. For example, a photolithography process may be used to form an etch mask, the dielectric layers 214, 212, and 210 are etched through the etch mask to form the via hole 216, and the etch mask is removed thereafter.

Figure 5:
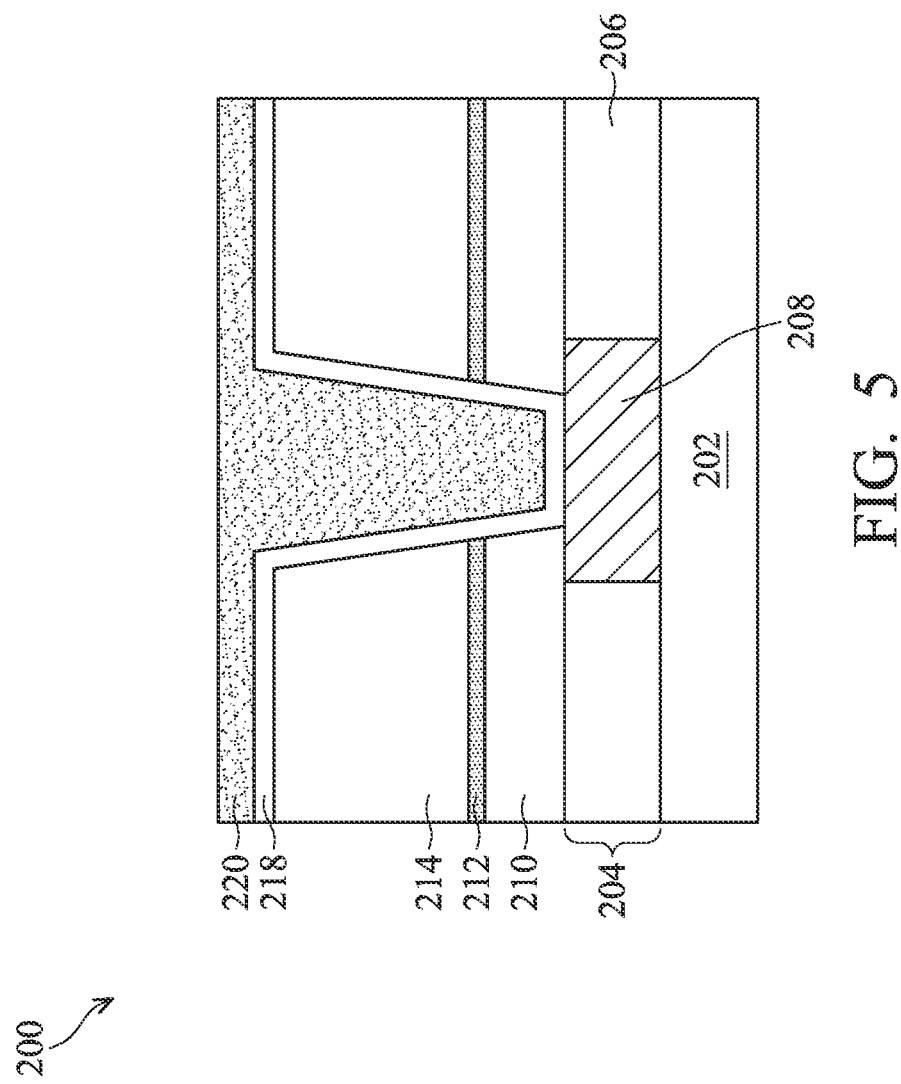

At operation 106, the method 100 (FIG. 2) deposits a barrier layer 218 in the via hole 216 and a filling metal 220 on the barrier layer 218, such as shown in FIG. 5. The barrier layer 218 may include a magnetic material such as Co or a non-magnetic material such as titanium nitride, tantalum nitride, or other suitable conductive diffusion barrier, and may be deposited using ALD, PVD, CVD, or other suitable deposition methods. In the illustrated embodiment, the barrier layer 218 is blanket deposited on a top surface of the dielectric layer 214, sidewalls of the via hole 216, and the exposed top surface of the metallization pattern 208 to form a substantially conformal layer. The term "substantially conformal" means a thickness of the deposited layer over different surfaces having a difference smaller than about 10 percent. The filling metal 220 may include a magnetic material such as Co or a non-magnetic material such as tungsten, titanium, tantalum, tungsten nitride, titanium nitride, tantalum nitride, a combination thereof, or other suitable metal or metal compound, and may be deposited using CVD, PVD, ALD, plating, or other suitable deposition methods. The filling metal 220 fills up the via hole 216.

Figure 6:
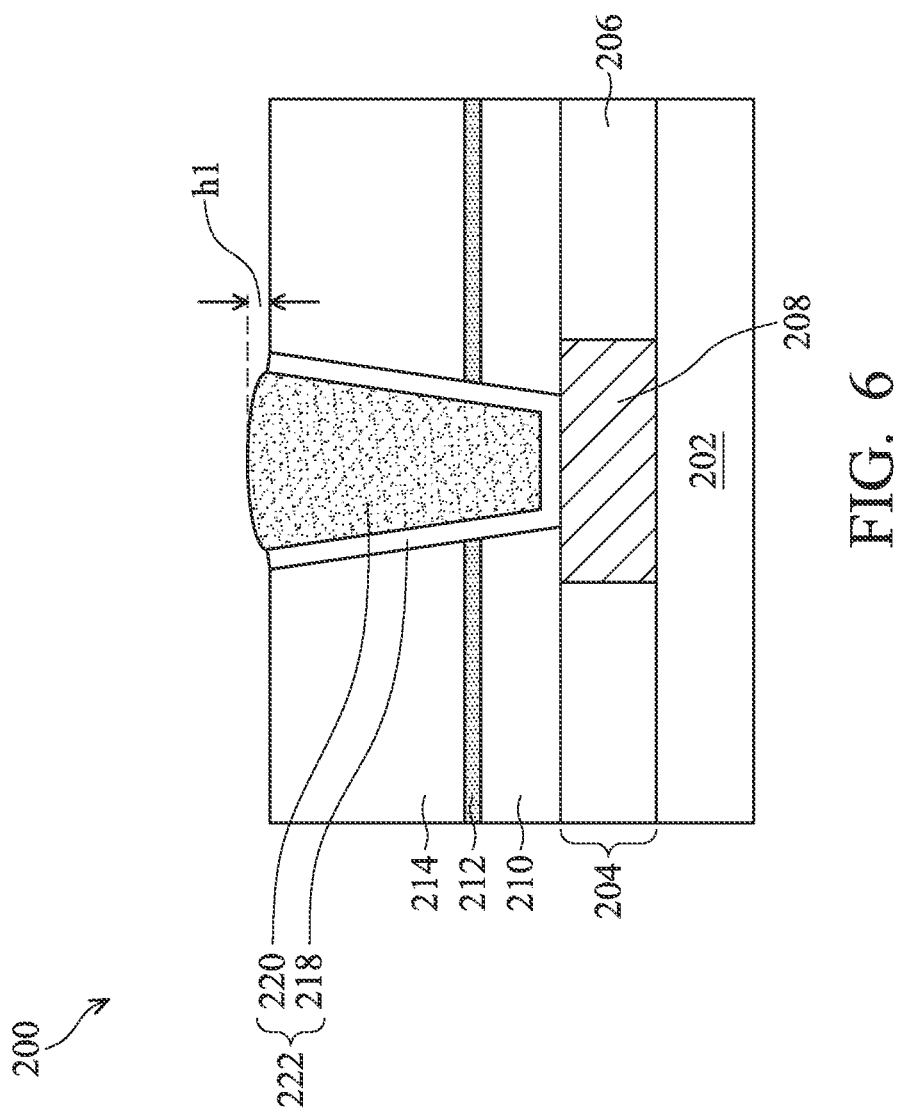
Figure 7:
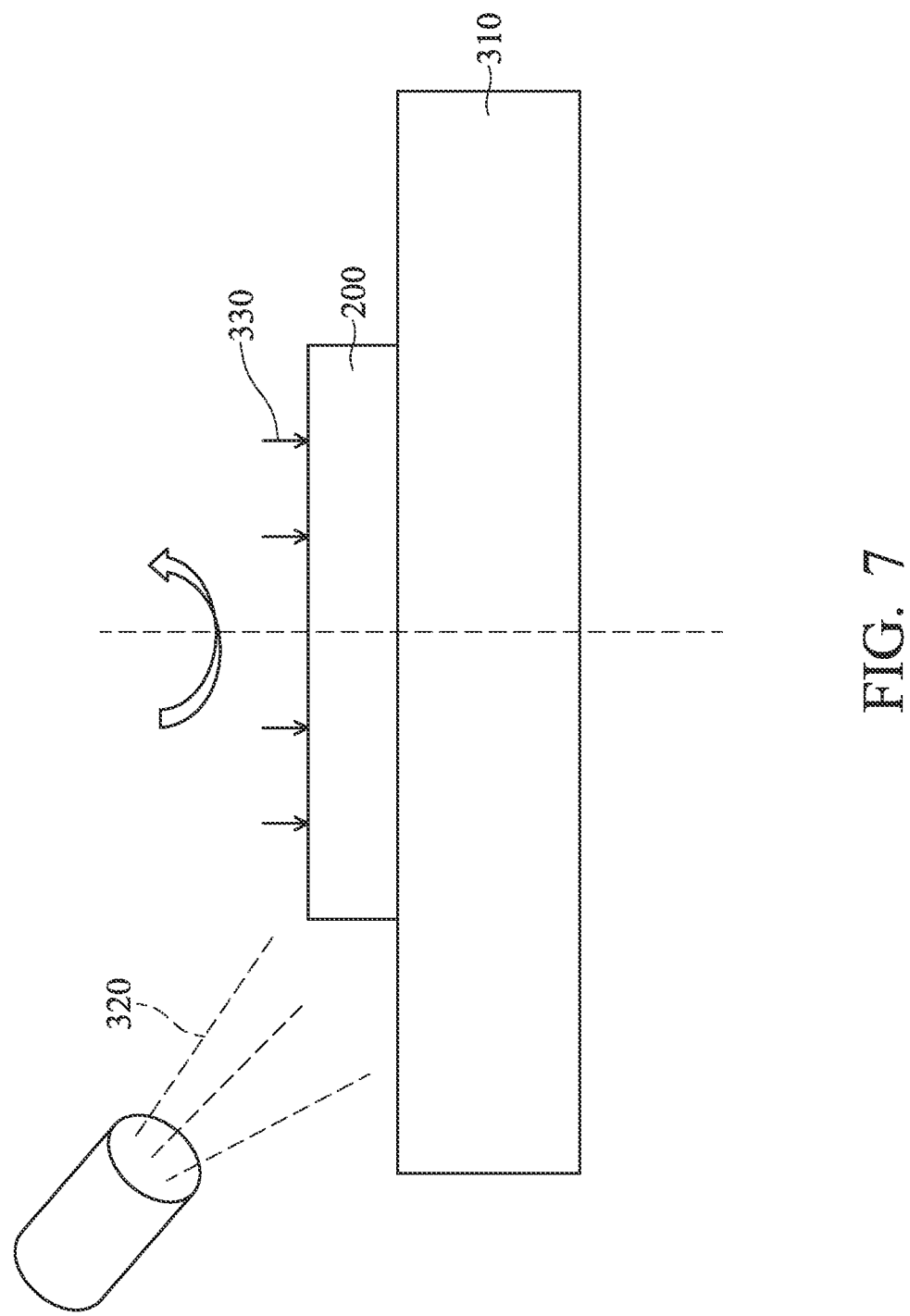

At operation 108, the method 100 (FIG. 2) performs a planarization process, such as a first chemical mechanical planarization (CMP) process, to the filling metal 220 and the barrier layer 218, thereby removing excessive materials from the top surface of the dielectric layer 214, such as shown in FIG. 6. The remaining portions of the barrier layer 218 and the filling metal 220 collectively define a bottom electrode via (BEVA) 222. FIG. 7 illustrates the first CMP process. The semiconductor device 200 is placed on a polish pad 310, with the front surface (top surface of the semiconductor device 200 in FIG. 6) facing and contacting the polish pad 310. The slurry 320 is dispensed onto the polish pad 310. The semiconductor device 200 is rotated and moved around on the polish pad 310, and a force 330 is applied to press the semiconductor device 200 against the polish pad 310. The slurry 320 may include some particles such as aluminum oxide for the polishing. Although material compositions of slurry 320 are generally targeted to achieve a uniform polish rate for polishing the metallic materials (in the filling metal 220 and the barrier layer 218) and the dielectric materials in the dielectric layer 214, the dielectric layer 214 may suffer higher CMP removal rate than the filling metal 220 and the barrier layer 218. Particularly, in the depicted embodiment, the slurry 320 may further include an inhibitor such as chemicals comprising functional group COOH to reduce metal corrosion to the filling metal 220, which causes lower metal removal rate during the first CMP process. The inhibitor may include some carbon-containing organic compound.

Referring back to FIG. 6, as a result of the first CMP process, the BEVA 222 has a convex top surface. A topmost portion of the BEVA 222 may be higher than the top surface of the dielectric layer 214 for a distance h1, which may range from about 5 Å to about 30 Å. If there is no further treatment to the BEVA 222, a bottom electrode layer would be formed above the BEVA 222 and polished in a bottom electrode planarization process to provide a flat surface for a subsequent deposition of layers (films) of an MTJ. However, due to the convex top surface of the BEVA 222, a portion of the bottom electrode layer directly above the BEVA 222 would be thinner than other portions. If the thinner portion of the bottom electrode layer is not thick enough, etching loss during the bottom electrode planarization process may create pores exposing the BEVA thereunder. The slurry used in the bottom electrode planarization process or a cleaning process may subsequently recess the BEVA through the pores and create a wavy surface, which is not suitable for deposition of films of an MTJ. As explained in greater detail below, a further treatment is applied to the top surface of the BEVA 220 to create a concave top surface.

Figure 8:
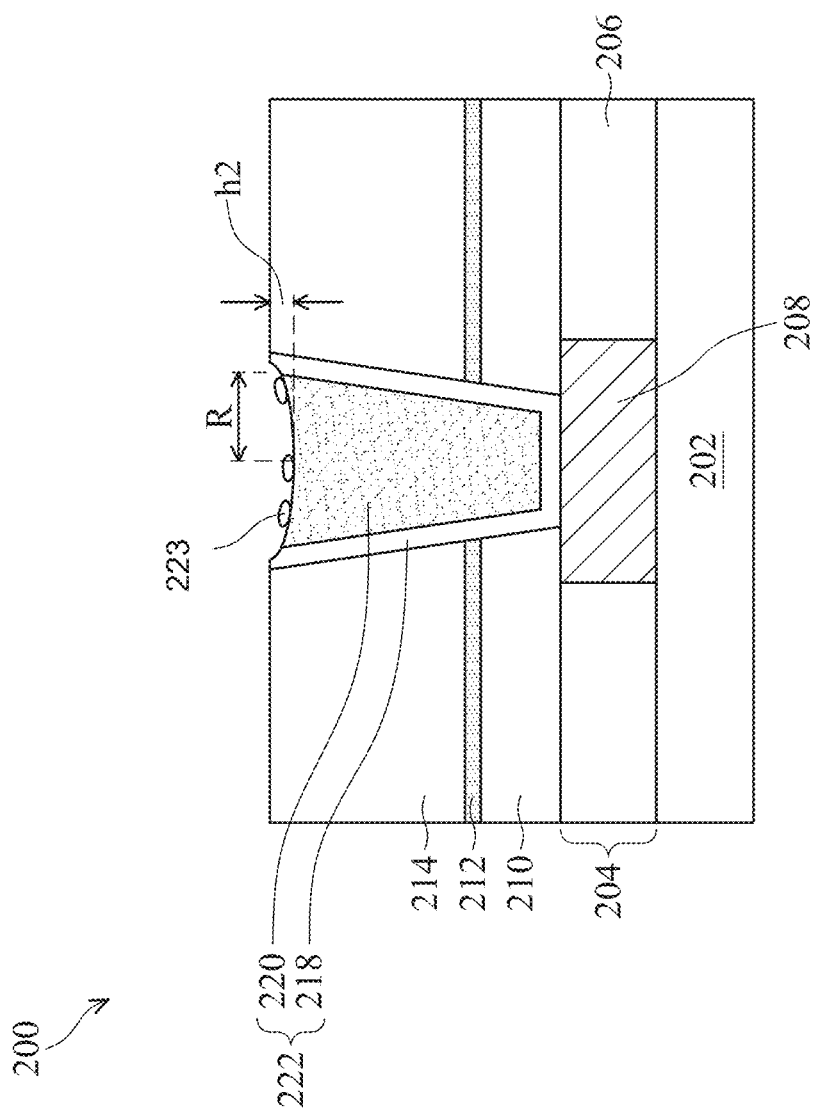

At operation 110, the method 100 (FIG. 2A) performs a surface treatment to further recess the top surface of the BEVA 222 to form a concave top surface. In some embodiments, the surface treatment is a second CMP process to the filling metal 220, thereby removing a top portion of the metallic material from the top surface of the filling metal 220. In the illustrated embodiment as shown in FIG. 8, a top portion of the barrier layer 218 adjacent the filling metal 220 is also recessed, such that an inner sidewall interfacing the filling metal 220 is lower than an outer sidewall interfacing the dielectric layer 214. A top portion of the barrier layer 218 adjacent the dielectric layer 214 is substantially coplanar with the dielectric layer 214. The recessed filling metal 220 has an edge-to-center distance (e.g., a radius for a plate in a top view) denoted as R, which may range from about 3 nm to about 30 nm. The depth h2 of the concave top surface as referenced to the top surface of the dielectric layer 214 may range from about 5 Å to about 30 Å. In some embodiments, a ratio of h2/R ranges from about 0.1 to about 1.0. If the ratio of h2/R is smaller than 0.1, the portion of the to-be-formed bottom electrode layer right above the BEVA 222 would not be thick enough to avoid exposing the BEVA 222 from a subsequent bottom electrode planarization process. If the ratio of h2/R is larger than 1.0, the recess is too deep for the uniform deposition of metallic materials of the to-be-formed bottom electrode layer.

Figure 9:
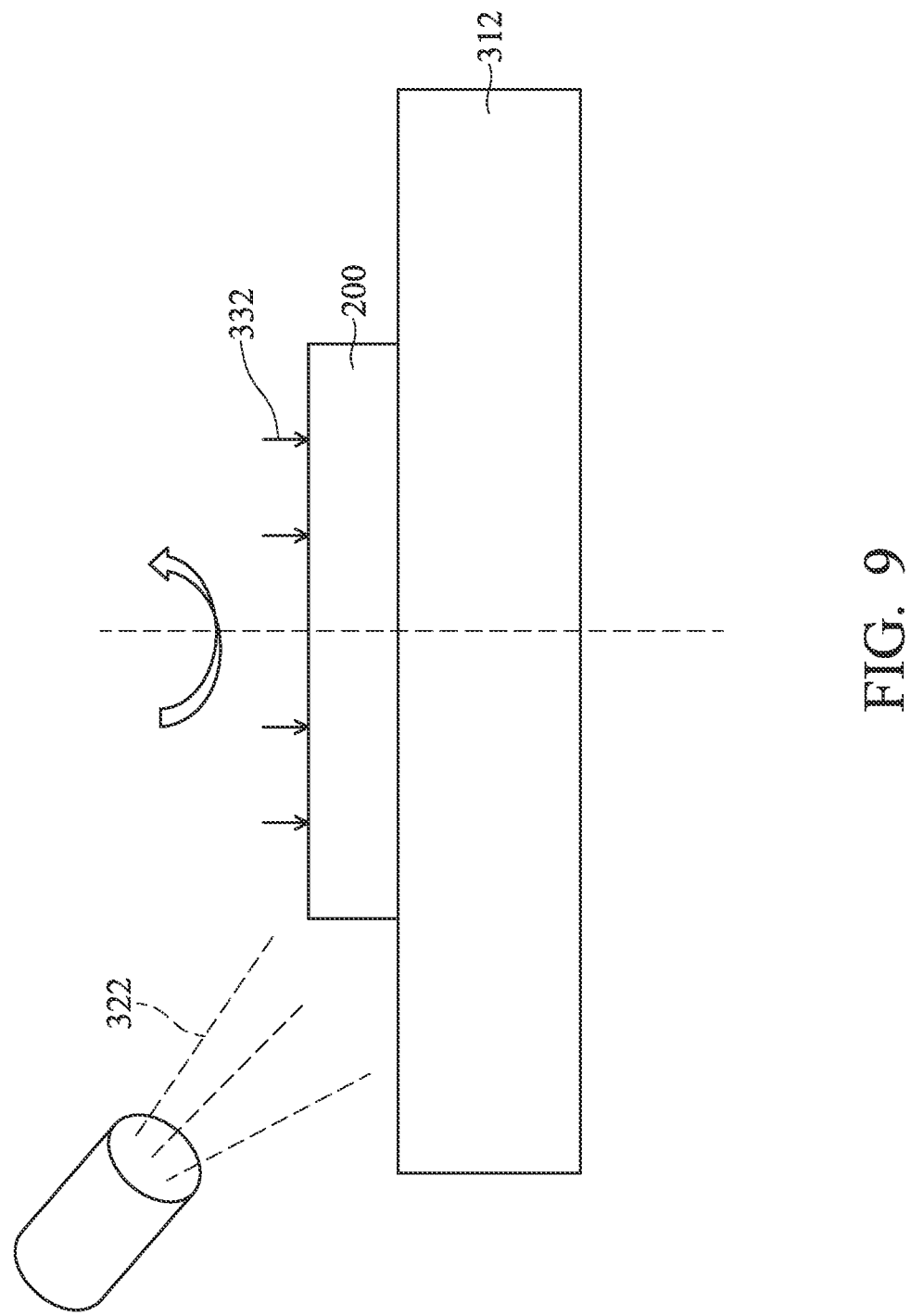

FIG. 9 illustrates the second CMP step. The semiconductor device 200 is placed on a polish pad 312, with the front surface facing and contacting the polish pad 312. In some instances, the polish pad 312 has a hardness different from the polish pad 312 used in the first CMP process. The polish pad 312 may be harder than the polish pad 310. The semiconductor device 200 is rotated and moved around on the polish pad 312, and a force 332 is applied to press the semiconductor device 200 against the polish pad 312. In some instances, the force 332 has a strength different from the force 330 used in the first CMP process. The force 332 may be weaker than the force 330 or even substantially no force is applied due to the stronger slurry 332 dispensed onto the polish pad 312. The slurry 322 may include some particles such as aluminum oxide for the polishing. The material compositions of the slurry 322 is different from the slurry 320 used in the first CMP process, as the slurry 322 is targeted at a higher removal rate of the filling metal 220. In some instance, the slurry 322 includes an oxidation-and-etching agent, which is substantially free in the slurry 320. The oxidation-and-etching agent is capable of oxidizing the top surface of the filling metal 220 and also capable of etching the oxide byproducts. In some embodiments, the oxidation-and-etching agent comprises a bleach that is dissolvable in water. In some exemplary embodiments, the oxidation-and-etching agent is a chlorine-and-oxygen-containing chemical, which may include HClO, NaClO, KClO, CaClO, etc. In furtherance of the embodiment, a weight percentage of the oxidation-and-etching agent in the slurry 322 is between about 0.5 percent and about 3 percent. If the ratio is below 0.5 percent, the concave top surface may not achieve an enough depth h2, such that the portion of the to-be-formed bottom electrode layer right above the BEVA 222 would not be thick enough to avoid exposing the BEVA 222 from a bottom electrode planarization process. If the ratio is above 3 percent, the concave top surface may be too deep for the uniform deposition of metallic materials of the to-be-formed bottom electrode layer. Referring back to FIG. 8, after the second CMP process, some oxide particles 223 of the metallic material in the filling metal 220 may remain on the concave top surface and subsequently be stacked between the filling metal 220 and the to-be-formed top electrode in form of nanoscale islands.

Figure 10:
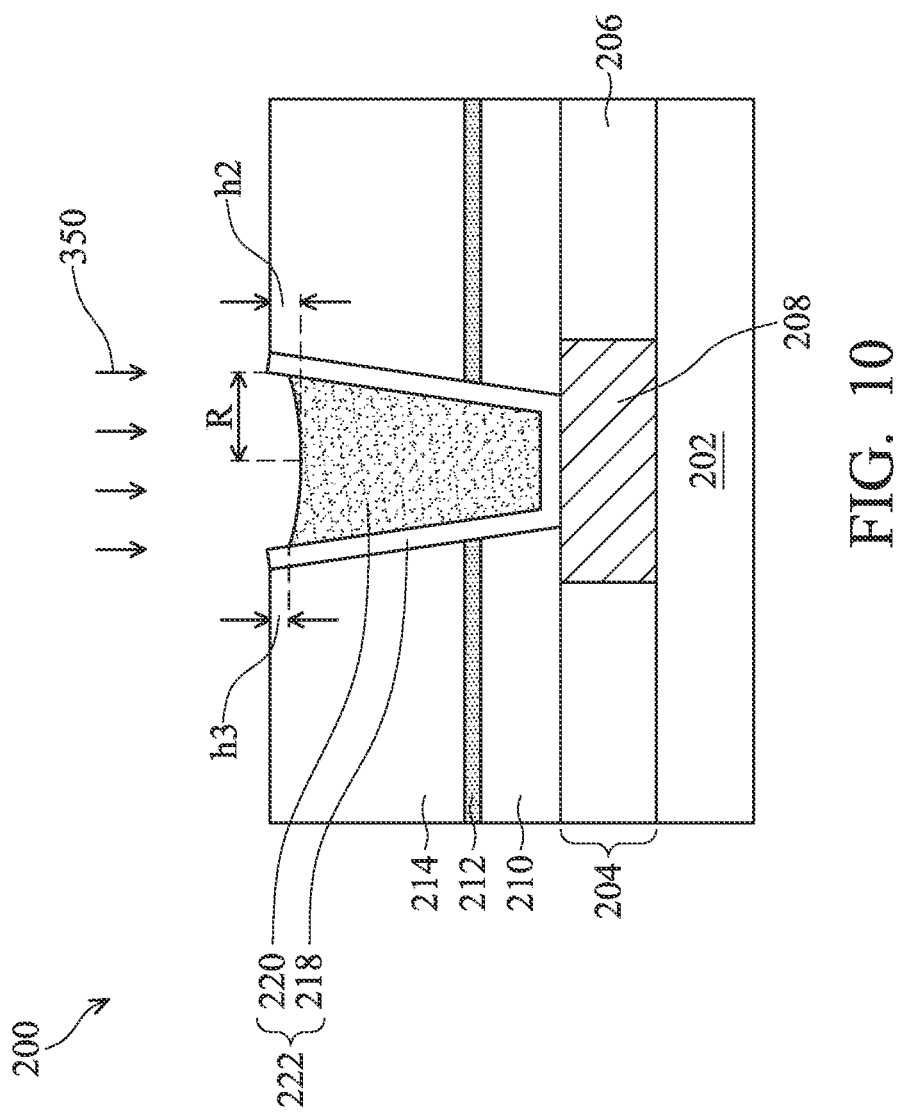
Figure 11:
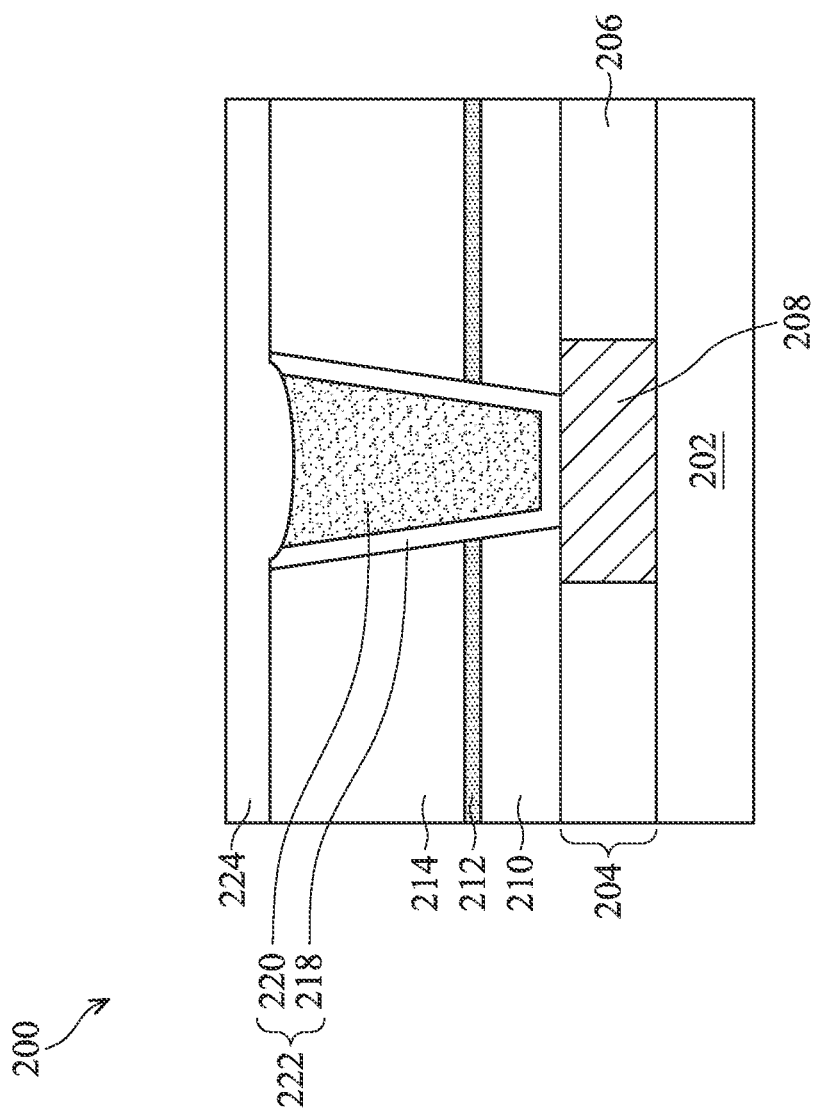

The reference is made to FIG. 10. In some embodiments, the surface treatment at operation 110 is an etch back process 350 to recess the filling metal 220. The etch back process 350 is selective to the filling metal 220, while the barrier layer 218 and the dielectric layer 214 may substantially remain intact. In some instances, the etch back process 350 may include a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some instance, the etch back process 350 may be a wet etching process that includes ammonium hydroxide ($NH_4OH$), hydrogen fluoride (HF), hydrogen peroxide ($H_2O_2$), or a combination thereof. In the illustrated embodiment as shown in FIG. 10, at the conclusion of operation 110, the barrier layer 218 has a topmost portion protruding out of the top surface of the dielectric layer 214, while even the edge portion of the filling metal 220 is below the top surface of the dielectric layer 214 for a distance h3. The distance h3 may range from about 3 Å to about 10 Å.

In the following figures, the manufacturing operations after the structure shown in FIG. 8 is formed are explained. However, the same operations can be applied to the structure as shown in FIG. 10.

At operation 112, the method 100 (FIG. 2A) blanket deposits a bottom electrode layer 224 over the BEVA 222 and over the dielectric layer 214. Particularly, the bottom electrode layer 224 electrically connects to the BEVA 222. In accordance with some embodiments of the present disclosure, the bottom electrode layer 224 is formed as a blanket layer, and may be formed using CVD, physical vapor deposition (PVD), electro-chemical plating (ECP), electroless plating, or other suitable deposition methods. The material of the bottom electrode layer 224 may include Cu, Al, Ti, Ta, W, Pt, Ni, Cr, Ru, TiN, TaN, combinations thereof, and/or multi-layers thereof. The bottom electrode layer 224 may be formed to have a thickness in a range about 1 nm to about 8 nm in some embodiments. The operation 112 further performs a bottom electrode planarization process, such as a CMP process, to planarize the top surface of the bottom electrode layer 224. In this way, the resultant bottom electrode layer 224 has a greater thickness above the BEVA 222 than above the dielectric layer 214. This is because the BEVA 222 has a concave top surface lower than the top surface of the dielectric layer 214. Moreover, the resultant bottom electrode layer 224 has a convex surface interfaced with the concave surface of the BEVA 222. As discussed above, at the interface there may be some metallic oxide particles of the filling metal 220 in form of nanoscale islands. The greater thickness of the bottom electrode layer 224 above the BEVA 222 protects the underneath BEVA 222 from being accidently exposed during the bottom electrode CMP process, which increases the process window by ensuring a flat top surface for subsequent MTJ formation.

Figure 12:
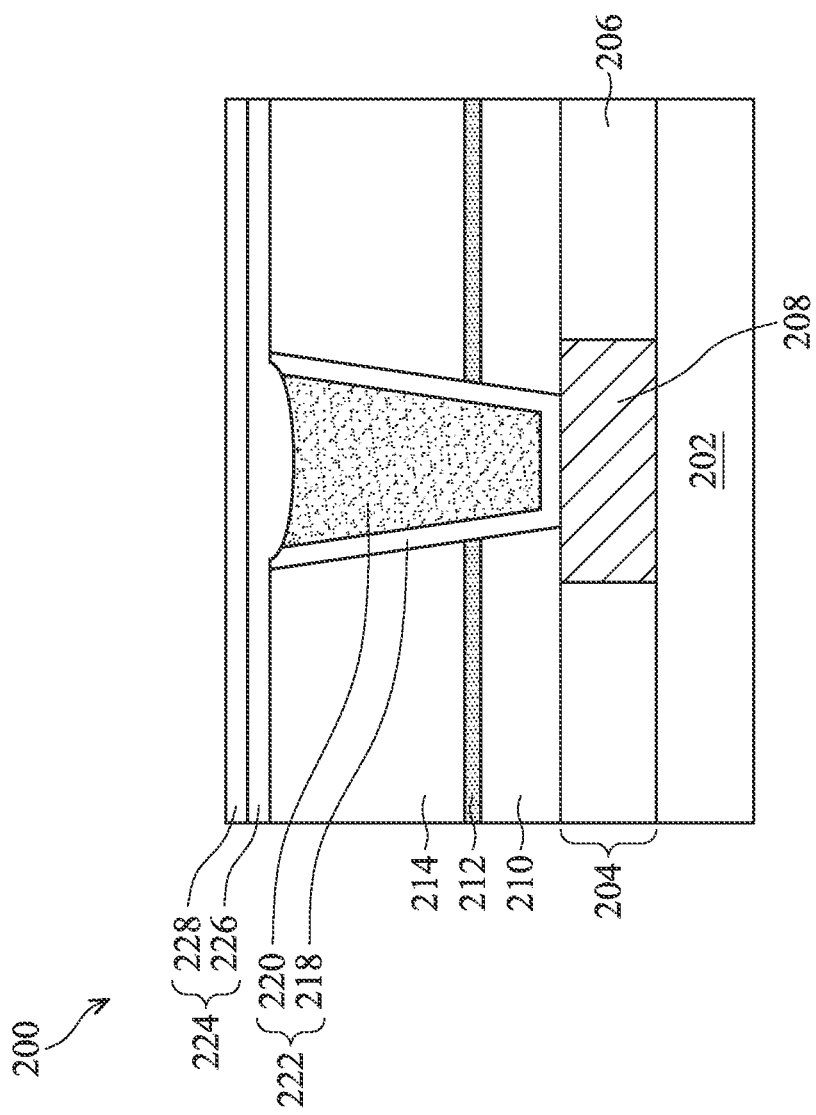
Figure 13:
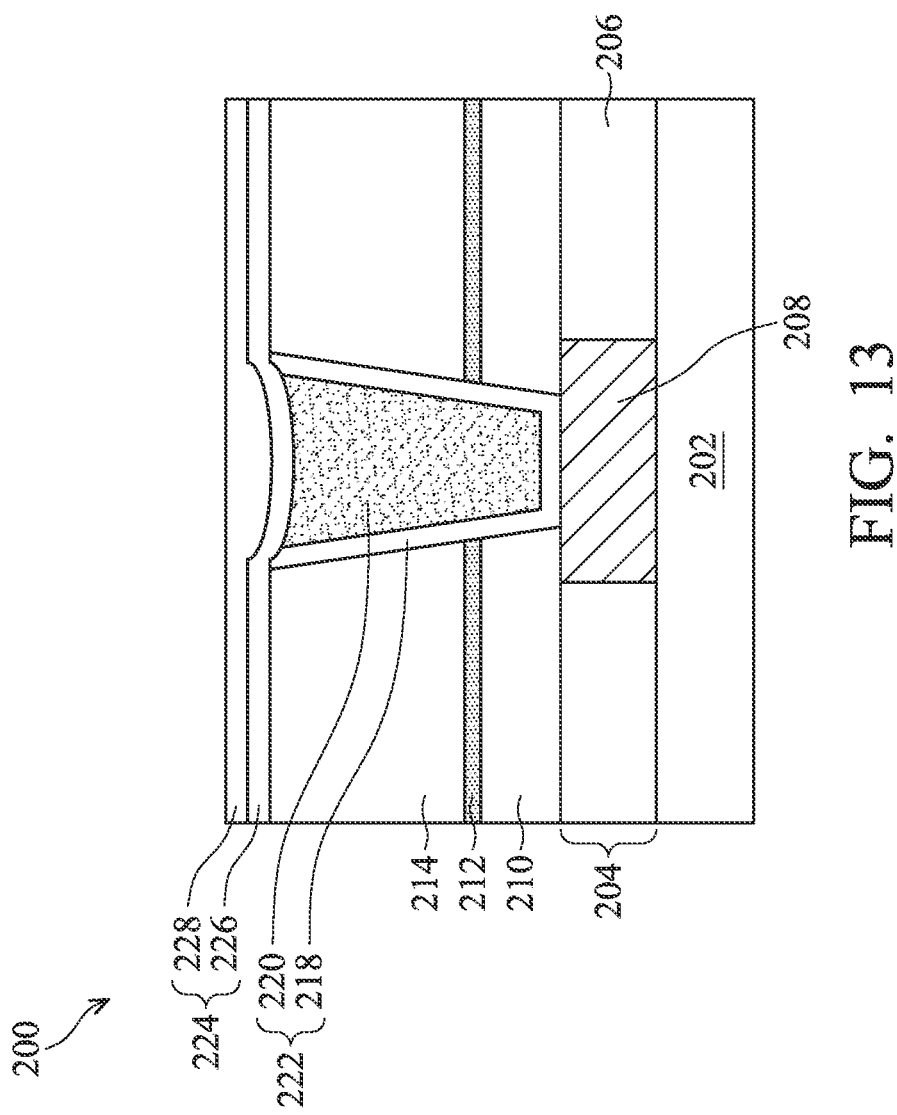

In some embodiments, the bottom electrode layer 224 can be a multi-layered structure, as shown in FIGS. 12 and 13. For example, the bottom electrode layer 224 may be double-layered. In some embodiments, the bottom electrode layer 224 includes a TiN layer 226 and a TaN layer 228 over the TiN layer 226. In some embodiments, a thickness of the TiN layer 226 is in a range from about 20 Å to about 40 Å. In some embodiments, a thickness of the TaN 228 layer is in a range from about 30 Å to about 50 Å. In some embodiments, the TiN layer 226 is deposited on the dielectric layer 214 and the BEVA 222, followed by planarizing a top surface of the deposited TiN layer 226, and the TaN layer 228 is then deposited on the planarized top surface of the TiN layer 226, as shown in FIG. 12. In some embodiments, the TiN layer 226 is blanket deposited to form a substantially conformal layer, and the TaN layer 228 is then deposited on the concave top surface of the TiN layer 226, followed by planarizing a top surface of the deposited TaN layer 228, as shown in FIG. 13.

At operation 114, the method 100 (FIG. 2A) forms a magnetic tunnel junction (MTJ) layer stack 230 over the bottom electrode layer 224. The MTJ layer stack 230 include a seed layer 232 a ferromagnetic pinned layer 234, a tunneling layer 236, a ferromagnetic free layer 238, and a capping layer 240 formed in sequence over the bottom electrode layer 224. The seed layer 232 may include Ta, TaN, Cr, Ti, TiN, Pt, Mg, Mo, Co, Ni, Mn, or alloys thereof, and serves to promote a smooth and uniform grain structure in overlying layers. The seed layer 232 may have a thickness in a range from about 10 Å to about 30 Å in some embodiments. The ferromagnetic pinned layer 234 may be formed of an anti-ferromagnetic (AFM) layer and a pinned ferroelectric layer over the AFM layer. The AFM layer is used to pin or fix the magnetic direction of the overlying pinned ferroelectric layer. The ferromagnetic pinned layer 234 may be formed of, for example, ferroelectric metal or alloy (e.g., Co, Fe, Ni, B, Mo, Mg, Ru, Mn, Ir, Pt, or alloys thereof).

The tunneling layer 236 is formed over the ferromagnetic pinned layer 234. The tunneling layer 236 is thin enough that electrons are able to tunnel through the tunneling layer 236 when a biasing voltage is applied on a resulting MTJ stack patterned from the MTJ layer stack 230. In some embodiments, the tunneling layer 236 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$), or combinations thereof. Exemplary formation methods of the tunneling layer 236 include sputtering, PVD, ALD, or the like.

Figure 14:
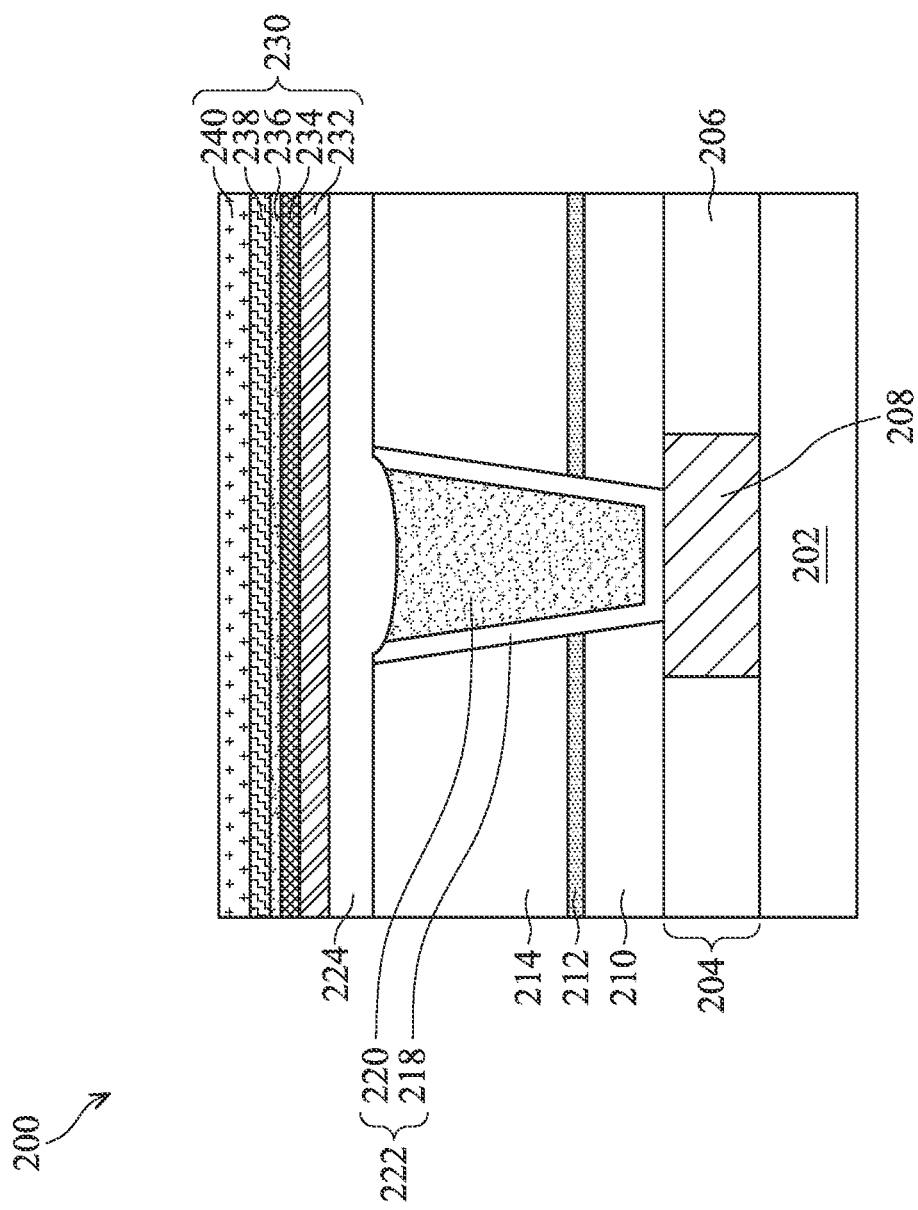
Figure 15:
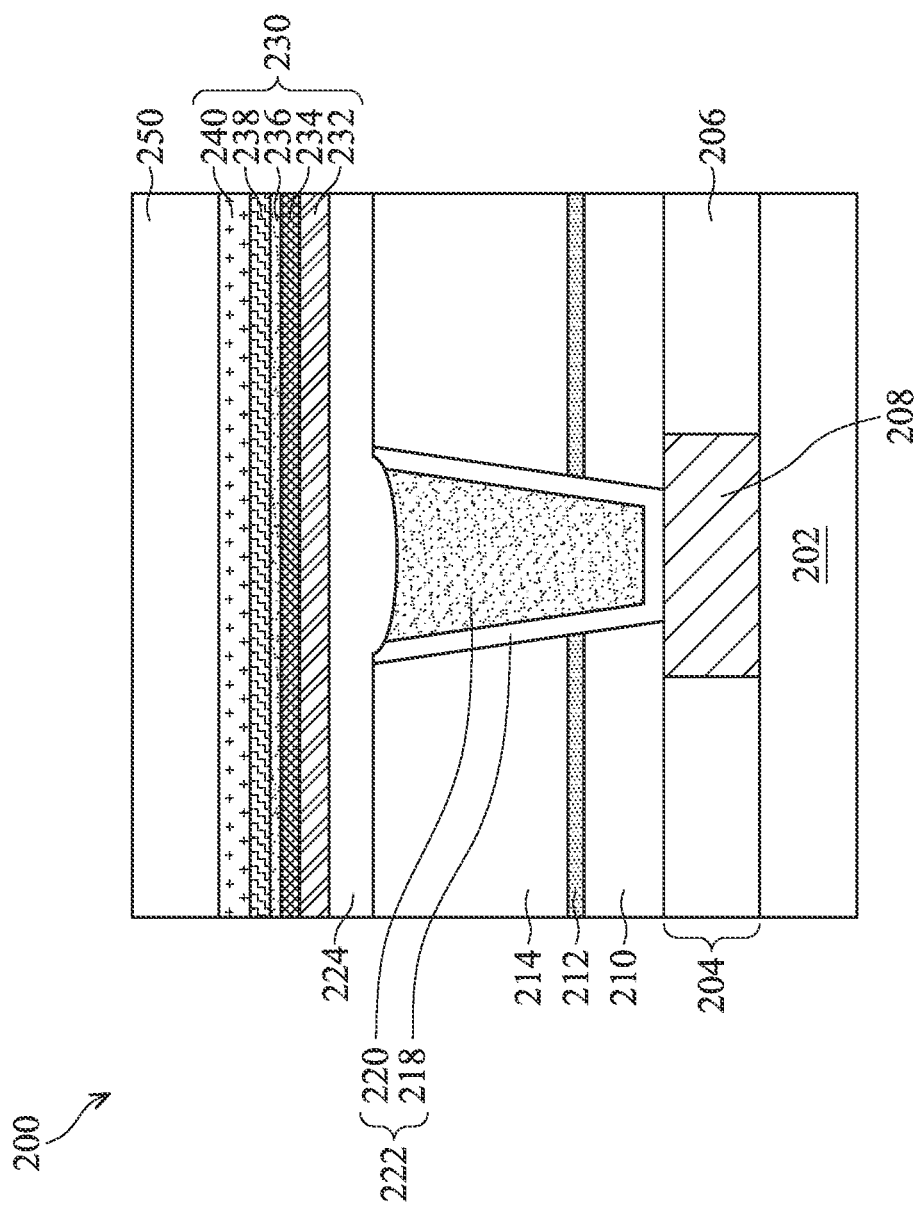

Still referring to FIG. 14, the ferromagnetic free layer 238 is formed over the tunneling layer 236. A direction of a magnetic moment of the ferromagnetic free layer 238 is not pinned because there is no anti-ferromagnetic material adjacent the ferromagnetic free layer 238. Therefore, the magnetic orientation of this layer 238 is adjustable, thus the layer 238 is regarded as a free layer. In some embodiments, the direction of the magnetic moment of the ferromagnetic free layer 238 is free to rotate parallel or anti-parallel to the pinned direction of the magnetic moment of the ferromagnetic pinned layer 234. The ferromagnetic free layer 238 may include a ferromagnetic material similar to the material in the ferromagnetic pinned layer 234. In some embodiments, the ferromagnetic free layer 238 includes Co, Fe, B, Mo, or combinations thereof. Exemplary formation methods of the ferromagnetic free layer 238 include sputtering, PVD, ALD, or the like. A total thickness of the ferromagnetic pinned layer 234, the tunneling layer 236, and the ferromagnetic free layer 238 is in a range from about 200 Å to about 250 Å.

The capping layer 240 is deposited over the ferromagnetic free layer 238. The capping layer 240 may include Ta, Co, B, Ru, Mo, MgO, AlO, or combinations thereof. In some embodiments, a thickness of the capping layer 240 is in a range from about 20 Å to about 40 Å. The capping layer 240 may be deposited by PVD or alternatively other suitable processes.

At operation 116, the method 100 (FIG. 2A) forms a top electrode layer 250 over the MTJ layer stack 230. In accordance with some embodiments of the present disclosure, the top electrode layer 250 is formed as a blanket layer, and may be formed using CVD, PVD, ECP, electroless plating, or other suitable deposition methods. The material of the top electrode layer 250 may include aluminum, titanium, tantalum, tungsten, or the like, alloys thereof, and/or multi-layers thereof. The top electrode layer 250 may be used as a hard mask in the subsequent patterning of MTJ layer stack 230, and may include a conductive layer formed of TiN, Ta, TaN, Ti, Ru, W, Si, alloys thereof, and/or multi-layers thereof. The top electrode layer 250 may be formed to have a thickness in a range about 10 nm to about 80 nm in some embodiments.

Figure 16:
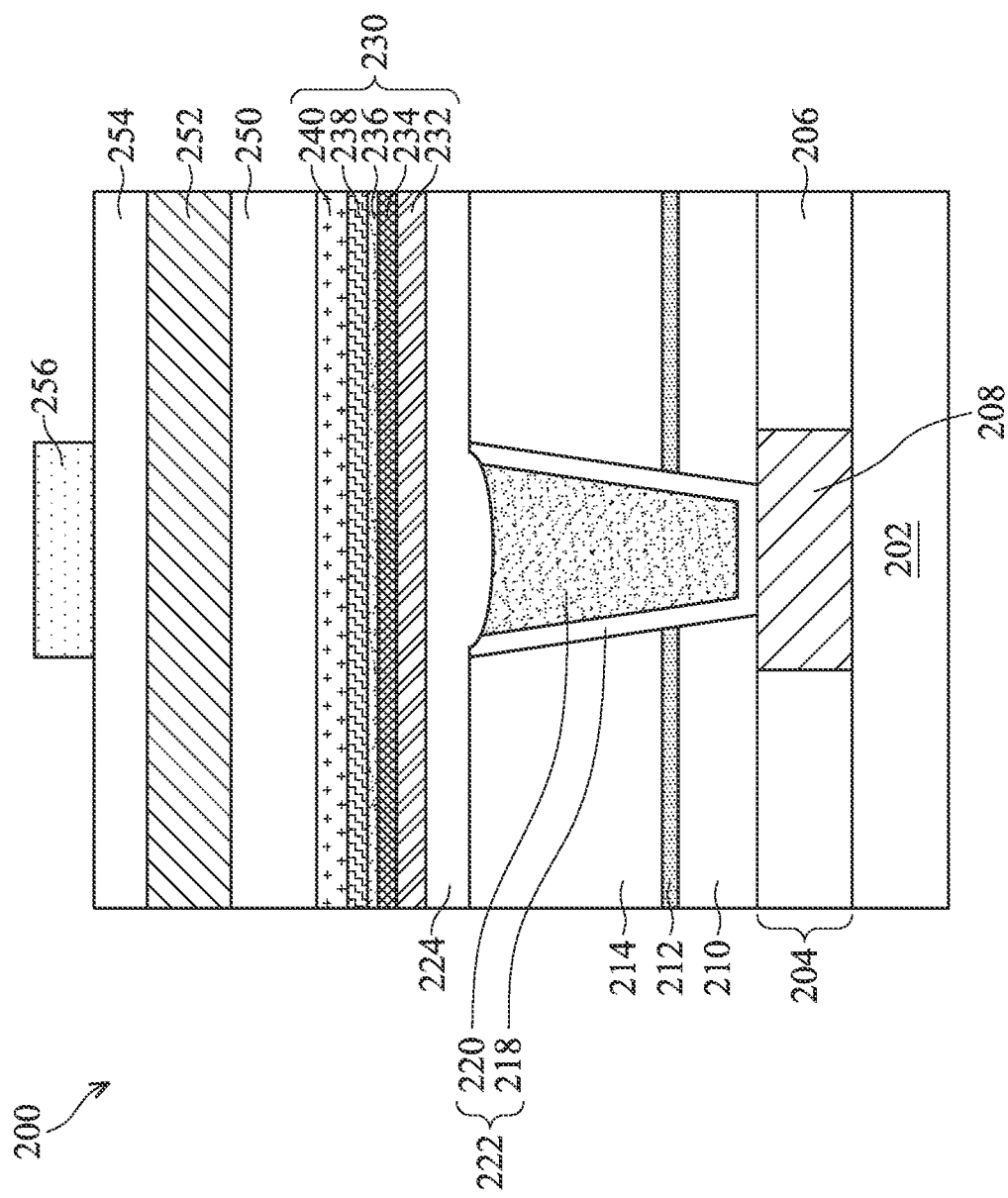

At operation 118, the method 100 (FIG. 2A) forms a tri-layer over the top electrode layer 250 and patterns the tri-layer and the top electrode layer 250. The tri-layer includes a bottom layer 252, a middle layer 254 over the bottom layer 252, and a top layer 256 over the middle layer 254, such as shown in FIG. 16. In accordance with some embodiments of the present disclosure, the bottom layer 252 may be cross-linked, and hence is different from typical photo resists used for light exposure. The bottom layer 252 may function as a bottom anti-reflective coating (BARC) when the top layer 256 is light-exposed. The middle layer 254 may be formed of a material including silicon and oxygen, which may be SiON, for example, while other similar materials may be used. The top layer 256 is formed of a photo resist. The top layer 256 is coated as a blanket layer, and is then patterned in a photo lithography process using a photo lithography mask. In a top view of the semiconductor device 200, the remaining portions of the top layer 256 may be arranged as an array.

Figure 17:
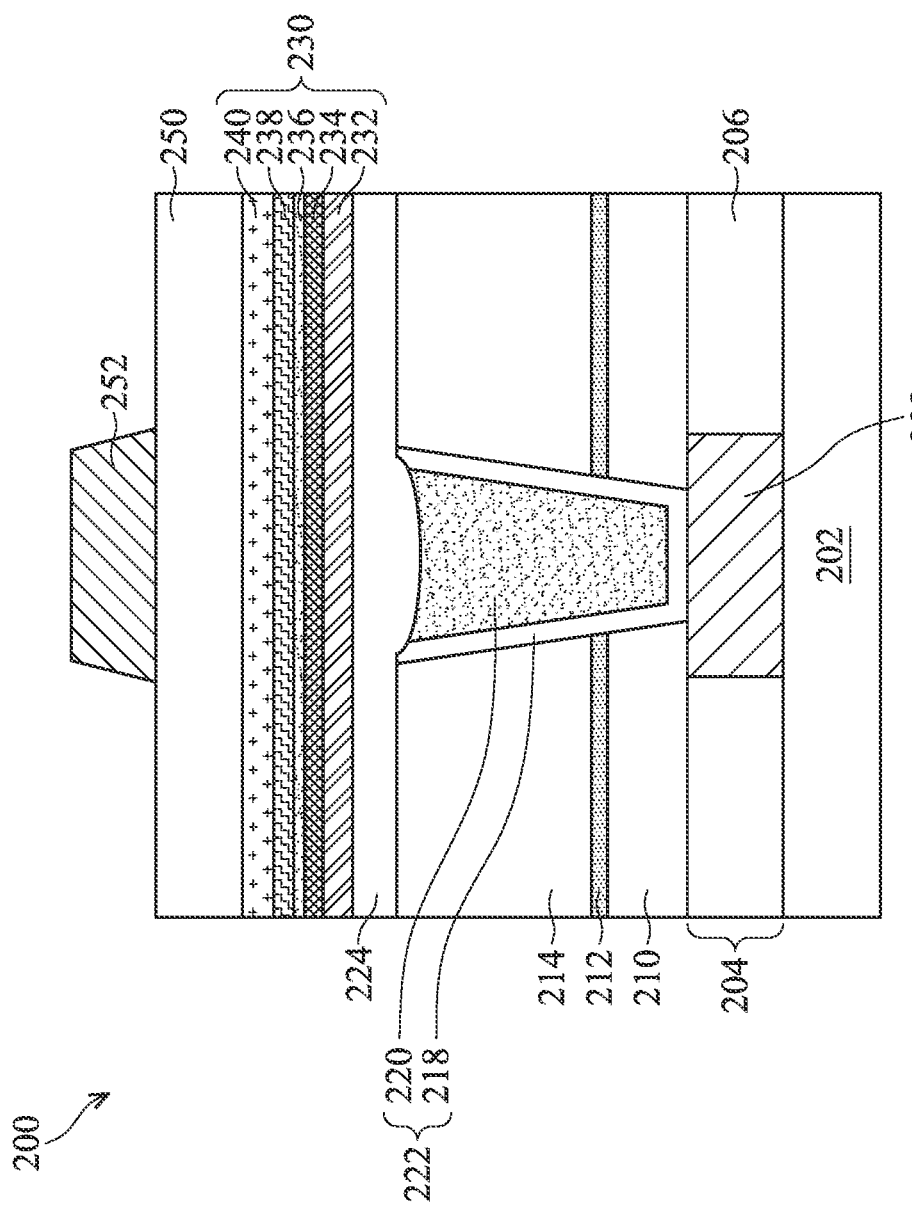
Figure 18:
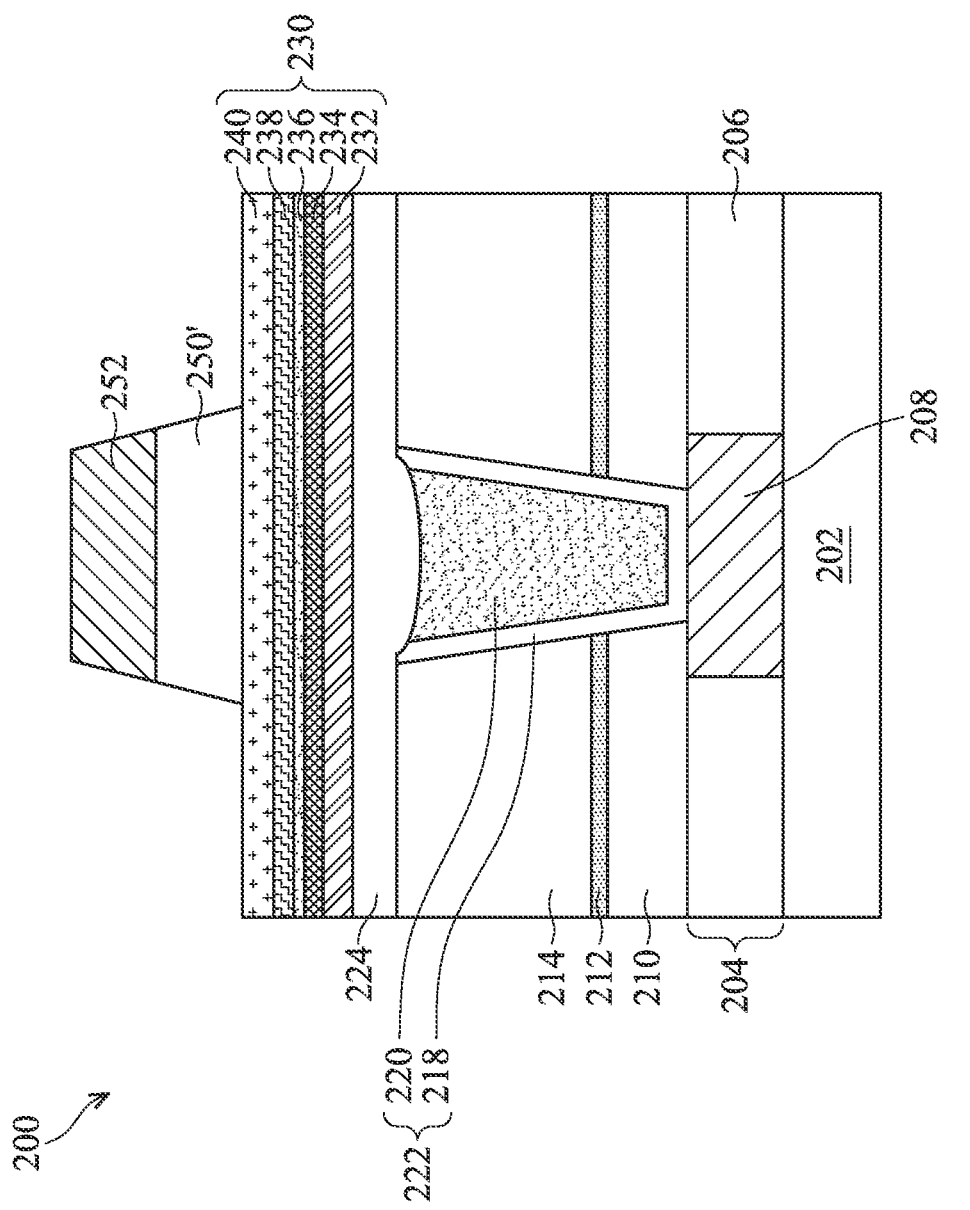
Figure 19:
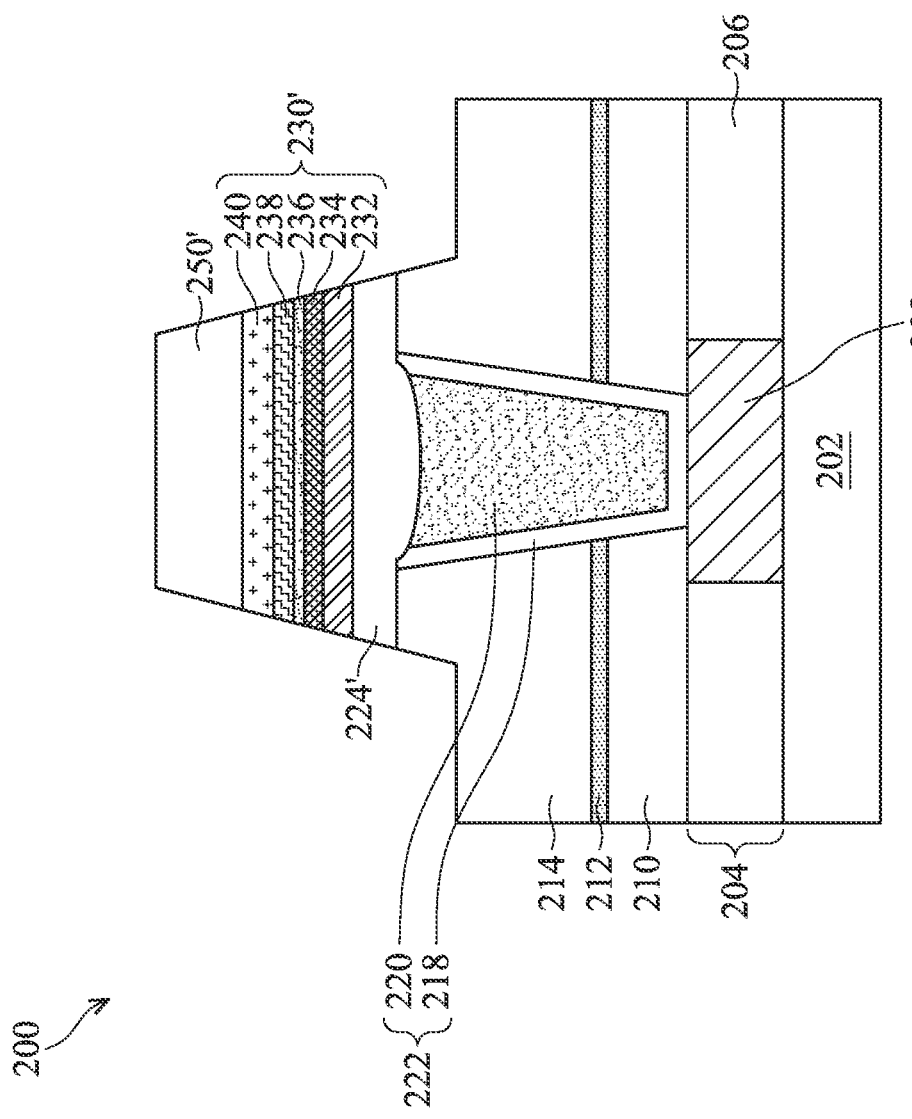

In subsequent steps at operation 118, the patterned top layer 256 is used as an etch mask to etch and pattern the underlying middle layer 254 and the bottom layer 252. The patterned top layer 256 and middle layer 254 may be consumed in the etch process or removed thereafter, using etching, stripping, ashing, or other suitable methods, such as shown in FIG. 17. In a subsequent step, the patterned bottom layer 252 is used as an etch mask to etch the underlying top electrode layer 250, forming a top electrode. The top electrode is denoted as the top electrode 250', such as shown in FIG. 18. The etching method may include a plasma etching method, such as a reactive ion etching (RIE) process. After the etching process, the remaining portions of the bottom layer 252 is removed. In a subsequent step, the top electrode 250' is used as an etch mask to pattern the underlying MTJ layer stack 230 and the bottom electrode layer 224, forming an MTJ 230' and a bottom electrode 224', such as shown in FIG. 19. The etching process also recesses the top surface of the dielectric layer 214. After the etching process, the top surface and sidewalls of the dielectric layer 214 and sidewalls of the bottom electrode 224' are exposed.

Figure 20:
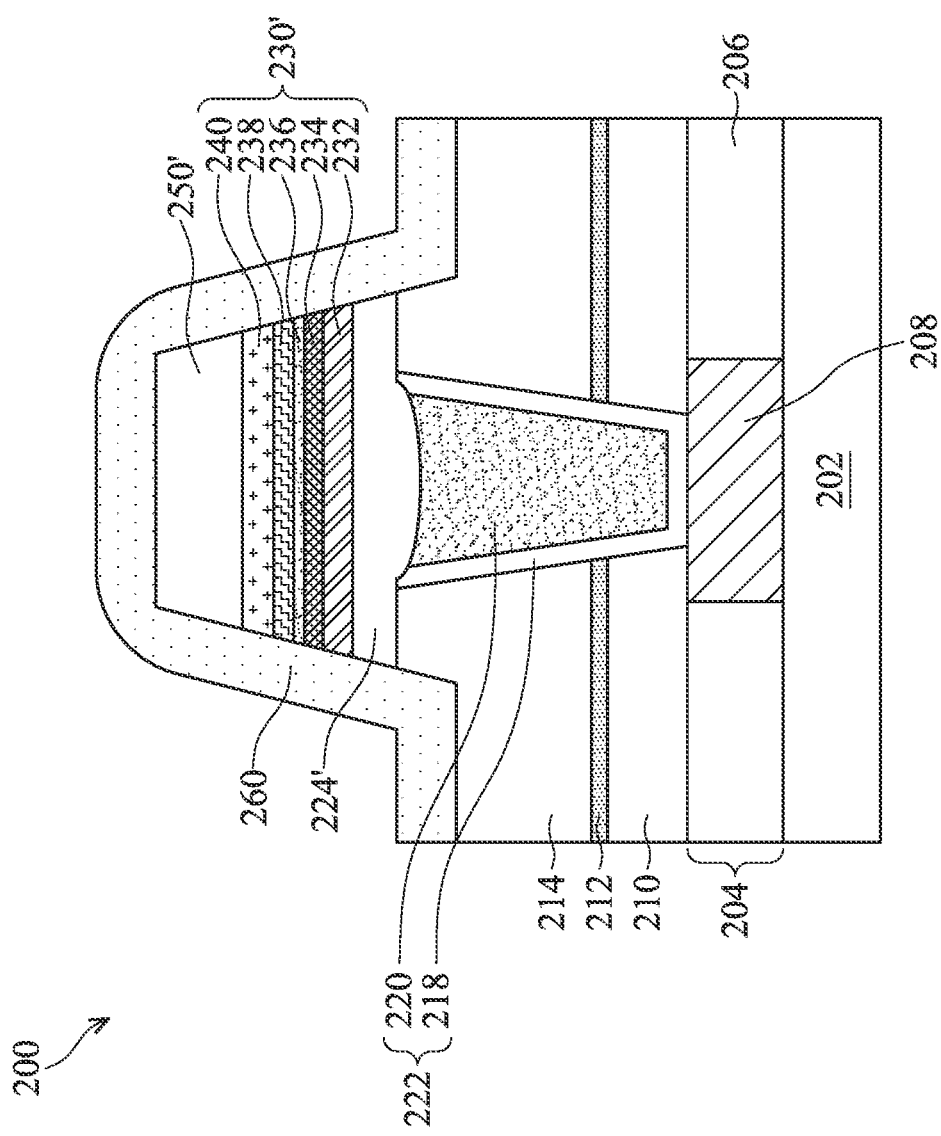
Figure 21:
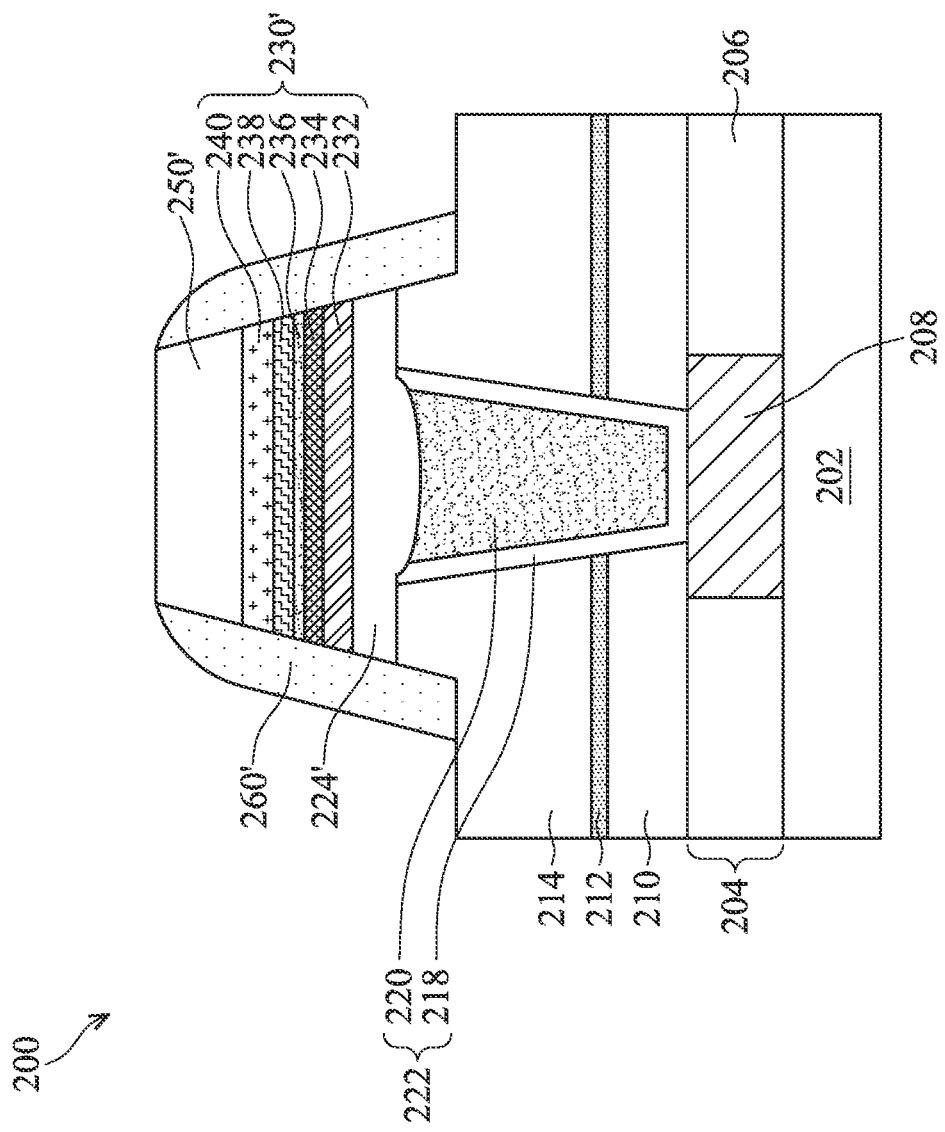

At operation 120, the method 100 (FIG. 2A) deposits a dielectric spacer layer 260 over the sidewalls of the top electrode 250', the MTJ 230', the bottom electrode 224', and sidewalls and top surface of the dielectric layer 214, such as shown in FIG. 20. For example, the operation 120 may deposit a blanket dielectric layer over the semiconductor device 200 using CVD, ALD, or other suitable methods. The spacer layer 260 may include one or more dielectric materials such as silicon oxide, silicon nitride, silicon oxynitride, or the like. The spacer layer 260 may include one or multiple layers of the dielectric materials in various embodiments. In a subsequent step, a portion of the spacer layer 260 on the top electrode 250' and on the top surface of the dielectric layer 214 is removed, such as shown in FIG. 21. A top surface of the top electrode 250' is exposed such that spacers 260' are formed. The spacers 260' laterally surrounds the sidewalls of the MTJ 230' and the top electrode 250'. The removing operation may be a suitable dry etch operation. In some embodiments, the dry etch operation in the present embodiment includes reactive ion etch (RIE) adopting fluorine-containing gases. The etch operation is conducted using a suitable etchant, such as $CF_4$, $CHF_3$, $CH_2F_2$, Ar, $N_2$, $O_2$ and He, in order to provide etch selectivity between the spacer layer 260 and the top electrode 250' and the dielectric layer 214.

Figure 22:
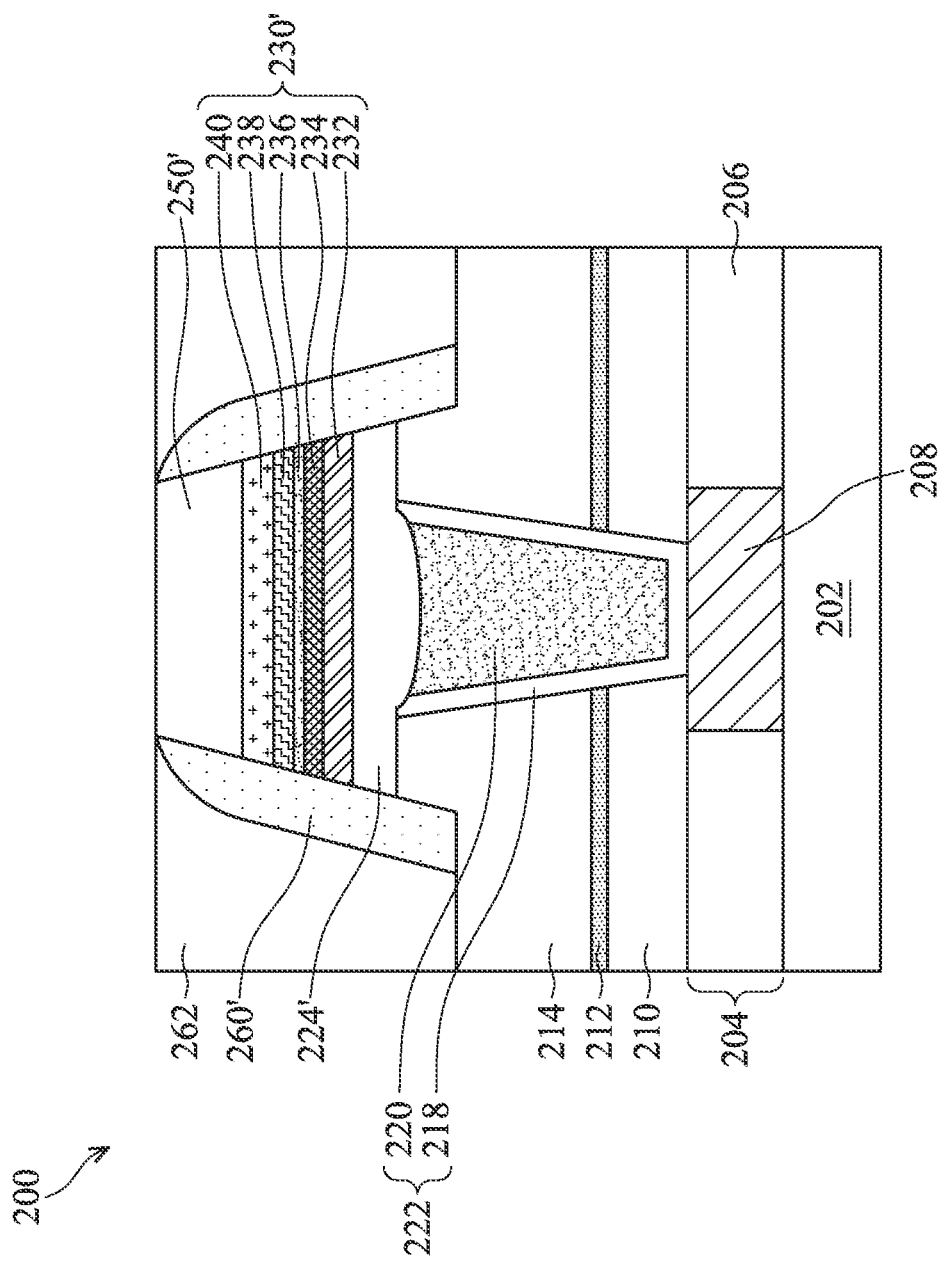

At operation 122, the method 100 (FIG. 2) forms a dielectric layer 262 over the spacers 260', such as shown in FIG. 22. The dielectric layer 262 can be an oxide, such as silicon dioxide, a low-k dielectric material such as carbon doped oxides, or an extreme low-k dielectric material such as porous carbon doped silicon dioxide. The dielectric layer 262 may be deposited using CVD, PVD, or other suitable methods. The operation 122 further performs a CMP process to planarize the top surfaces of the dielectric layer 262 and the top electrode 250'.

Figure 23:
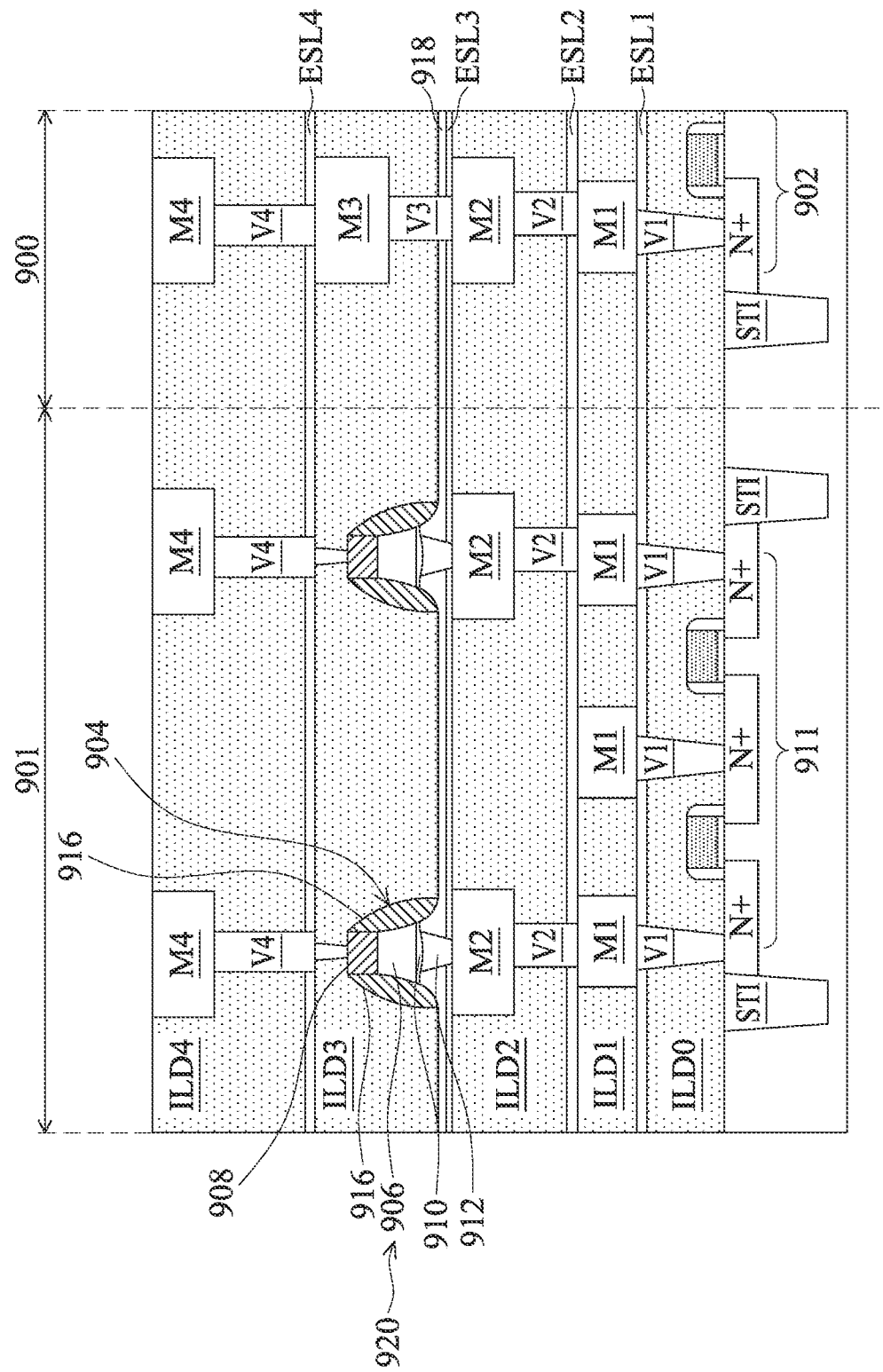
FIG. 23 illustrates an integrated circuit including MRAM devices and logic devices, in accordance with some embodiments.

FIG. 23 illustrates an integrated circuit including MRAM cells and logic devices. The integrated circuit includes a logic region 900 and an MRAM region 901. The logic region 900 may include circuitry, such as exemplary transistors, for processing information received from the MRAM cells 904 in the MRAM region 901 and for controlling reading and writing functions of the MRAM cells 904. In some embodiments, the MRAM cell 904 includes an MTJ 906, a top electrode 908 over the MTJ 906, a bottom electrode 910 under the MTJ stack 906, and a BEVA 912 under the bottom electrode 910. The MRAM cell 904 further includes spacers 916 laterally surrounds the MTJ 906, the top electrode 908, and a top portion of the BEVA 912.

As depicted, the integrated circuit is fabricated using five metallization layers, labeled as M1 through M4, with five layers of metallization vias or interconnects, labeled as V2 through V4. Other embodiments may contain more or fewer metallization layers and a corresponding more or fewer number of vias. The logic region 900 includes a full metallization stack, including a portion of each of metallization layers M1-M4 connected by interconnects V2-V4, with M1 connecting the stack to a source/drain contact of a logic transistor 902. The MRAM region 901 includes a full metallization stack connecting the MRAM cells 904 to the transistors 911 in the MRAM region 901, and a partial metallization stack connecting a source line to the transistors 911 in the MRAM region 901. The multiple MRAM cells 904 form an MRAM array 920 that are depicted as being fabricated in between the top of the M2 layer and the bottom the M4 layer. Also included in the integrated circuit is a plurality of ILD layers. Five ILD layers, identified as ILD0 through ILD4 are depicted in FIG. 23 as spanning the logic region 900 and the MRAM region 901. The ILD layers may provide electrical insulation as well as structural support for the various features of the integrated circuit during many fabrication process steps. The ILD layers between two metallization layers may include etch stop layers, identified as ESL1-ESL4 therebetween to signaling the termination point of an etching process and protect any underlying layer or layers during the etching process.

Although not intended to be limiting, one or more embodiments of the present disclosure provide many benefits to a semiconductor device and the formation thereof. For example, embodiments of the present disclosure provide a semiconductor device with an array of MRAM cells (devices) in an MRAM region. The bottom electrode via has a concave top surface (a dishing profile), allowing a bottom electrode formed thereon to be thicker. The thicker portion of the bottom electrode increases process window in ensuring a flat top surface to host layers (films) of an MTJ formed thereon. The MRAM cells of the present disclosure can be implemented as a standalone memory device or be implemented as an embedded memory that is integrated with logic devices. Furthermore, formation of this semiconductor device can be readily integrated into existing semiconductor fabrication processes.

In one exemplary aspect, the present disclosure is directed to a method. The method includes forming a dielectric layer over a substrate, the substrate having a metal line therein, forming a via hole in the dielectric layer, thereby exposing the metal line, depositing a filling metal in the via hole and over a top surface of the dielectric layer, performing a first chemical mechanical planarization (CMP) process to the filling metal, thereby exposing the top surface of the dielectric layer, performing a surface treatment to a top surface of the filling metal, thereby forming a concave top surface of the filling metal, wherein the surface treatment is different from the first CMP process, forming a bottom electrode layer over the concave top surface of the filling metal, such that the bottom electrode layer has a center portion that is thicker than a peripheral portion, forming a memory stack over the bottom electrode layer, forming a top electrode layer on the memory stack, and patterning the top electrode layer, the memory stack, and the bottom electrode layer, thereby forming a memory cell. In some embodiments, the memory stack is a magnetic tunneling junction (MTJ) stack. In some embodiments, the method further includes prior to the depositing of the filling metal, forming a conformal barrier layer in the via hole. In some embodiments, the surface treatment is a second CMP process. In some embodiments, the first and second CMP processes differ in one of polish pad softness, force applied in pressing the substrate, and slurry material composition. In some embodiments, the second CMP process includes applying a slurry containing an oxidation-and-etching agent that is free in the first CMP process. In some embodiments, the oxidation-and-etching agent has a weight percentage in the slurry ranging from about 0.5 percent to about 3 percent. In some embodiments, the surface treatment is a selective etching process. In some embodiments, the selective etching process recesses an edge portion of the concave top surface of the filling metal below the top surface of the dielectric layer. In some embodiments, the concave top surface of the filling metal has an edge-to-center distance and a depth, a ratio of the depth and the edge-to-center distance ranges from about 0.2 to about 1.0.

In another exemplary aspect, the present disclosure is directed to a method of forming a memory device. The method includes providing a substrate, forming a dielectric layer on the substrate, forming a via hole in the dielectric layer, depositing a first metal layer in the via hole and over the dielectric layer, performing a first planarization process to the first metal layer, thereby exposing a top surface of the dielectric layer and forming a metallic via in the via hole, wherein a top surface of the metallic via is convex, performing a surface treatment process to the top surface of the metallic via, the top surface of the metallic via being concave after the performing of the surface treatment process, depositing a second metal layer over the metallic via and the dielectric layer, and performing a second planarization process to the second metal layer, wherein a portion of the second metal layer directly above the metallic via is thicker than other portions of the second metal layer. In some embodiments, the method further includes prior to the depositing of the first metal layer, depositing a conformal barrier layer in the via hole. In some embodiments, the conformal barrier layer remains substantially intact during the surface treatment process. In some embodiments, after the performing of the surface treatment, a first sidewall of the conformal barrier layer interfacing the dielectric layer is at a same height with the top surface of the dielectric layer, and a second sidewall of the conformal barrier layer interfacing the metallic via is below the top surface of the dielectric layer. In some embodiments, the surface treatment includes applying an oxidation-and-etching agent to the top surface of the metallic via. In some embodiments, the method further includes forming a magnetic tunnel junction (MTJ) stack on the second metal layer, forming a third metal layer on the MTJ stack, and patterning the third metal layer, the MTJ stack, and the second metal layer, thereby forming a plurality of MTJ cells.

In another exemplary aspect, the present disclosure is directed to a memory device. The memory device includes a substrate comprising an inter-metal dielectric layer having a metal line, a dielectric layer over the substrate, a bottom electrode via through the dielectric layer and in contact with the metal line, a bottom electrode over the bottom electrode via, a center portion of the bottom electrode directly above the bottom electrode via being thicker than an edge portion of the bottom electrode, a magnetic tunneling junction (MTJ) element over the bottom electrode, and a top electrode over the MTJ element. In some embodiments, the memory device further includes metallic oxide particles stacked between the center portion of the top surface of the bottom electrode via and a bottom surface of the bottom electrode. In some embodiments, the bottom electrode via includes a conformal barrier layer and a filling metal. In some embodiments, the bottom electrode includes a bottom layer interfacing the bottom electrode via and a top layer over the bottom layer, the bottom layer and the top layer include different material compositions, and a top surface of the bottom layer has a concave profile.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer over a substrate, the substrate having a metal line therein;
    forming a via hole in the dielectric layer, thereby exposing the metal line;
    depositing a filling metal in the via hole and over a top surface of the dielectric layer;
    performing a first chemical mechanical planarization (CMP) process to the filling metal, thereby exposing the top surface of the dielectric layer;
    performing a surface treatment to a top surface of the filling metal, thereby forming a concave top surface of the filling metal, wherein the surface treatment is different from the first CMP process;
    forming a bottom electrode layer over the concave top surface of the filling metal, such that the bottom electrode layer has a center portion that is thicker than a peripheral portion;
    forming a memory stack over the bottom electrode layer;
    forming a top electrode layer on the memory stack; and
    after the forming of the top electrode layer, patterning the top electrode layer, the memory stack, and the bottom electrode layer, thereby forming a memory cell, wherein after the patterning a top surface of the bottom electrode layer extends from a first edge point to a second edge point and a bottom surface of the memory stack extends from the first edge point to the second edge point.

2. The method of claim 1, wherein the memory stack is a magnetic tunneling junction (MTJ) stack.

3. The method of claim 1, further comprising:
    prior to the depositing of the filling metal, forming a conformal barrier layer in the via hole.

4. The method of claim 1, wherein the surface treatment is a second CMP process.

5. The method of claim 4, wherein the first and second CMP processes differ in one of polish pad softness, force applied in pressing the substrate, and slurry material composition.

6. The method of claim 4, wherein the second CMP process includes applying a slurry containing an oxidation-and-etching agent that is free in the first CMP process.

7. The method of claim 6, wherein the oxidation-and-etching agent has a weight percentage in the slurry ranging from about 0.5 percent to about 3 percent.

8. The method of claim 1, wherein the surface treatment is a selective etching process.

9. The method of claim 8, wherein the selective etching process recesses an edge portion of the concave top surface of the filling metal below the top surface of the dielectric layer.

10. The method of claim 1, wherein the concave top surface of the filling metal has an edge-to-center distance and a depth, a ratio of the depth and the edge-to-center distance ranges from about 0.2 to about 1.0.

11. A method, comprising:
    providing a substrate;
    forming a dielectric layer on the substrate;
    forming a via hole in the dielectric layer;
    depositing a first metal layer in the via hole and over the dielectric layer;
    performing a first planarization process to the first metal layer, thereby exposing a top surface of the dielectric layer and forming a metallic via in the via hole, wherein a top surface of the metallic via is convex;
    performing a surface treatment process to the convex top surface of the metallic via, wherein the convex top surface of the metallic via becomes a concave top surface of the metallic via after the performing of the surface treatment process;
    depositing a second metal layer over the concave top surface of the metallic via and the dielectric layer; and
    performing a second planarization process to the second metal layer, wherein a portion of the second metal layer directly above the concave top surface of the metallic via is thicker than other portions of the second metal layer.

12. The method of claim 11, further comprising:
    prior to the depositing of the first metal layer, depositing a conformal barrier layer in the via hole.

13. The method of claim 12, wherein the conformal barrier layer remains substantially intact during the surface treatment process.

14. The method of claim 12, wherein after the performing of the surface treatment, a first sidewall of the conformal barrier layer interfacing the dielectric layer is at a same height with the top surface of the dielectric layer, and a second sidewall of the conformal barrier layer interfacing the metallic via that has the concave top surface is below the top surface of the dielectric layer.

15. The method of claim 11, wherein the surface treatment includes applying an oxidation-and-etching agent to the convex top surface of the metallic via.

16. The method of claim 11, further comprising:
    forming a magnetic tunnel junction (MTJ) stack on the second metal layer;
    forming a third metal layer on the MTJ stack; and
    patterning the third metal layer, the MTJ stack, and the second metal layer, thereby forming a plurality of MTJ cells.

17. A method, comprising:
    depositing an inter-metal dielectric layer on a substrate;

forming a metal line in the inter-metal dielectric layer;
depositing a dielectric layer over the metal line;
forming a bottom electrode via through the dielectric layer and in contact with the metal line;
forming a bottom electrode over the bottom electrode via, wherein a center portion of the bottom electrode directly above the bottom electrode via is thicker than an edge portion of the bottom electrode, wherein a topmost portion of the bottom electrode via is above a bottommost portion of the bottom electrode;
forming a magnetic tunneling junction (MTJ) element over the bottom electrode; and
forming a top electrode over the MTJ element, wherein after the forming of the top electrode a top surface of the dielectric layer is exposed, and wherein after the top surface of the dielectric layer is exposed a width of a bottom surface of the MTJ element is larger than a width of a top surface of the bottom electrode via.

18. The method of claim 17, further comprising:
performing a surface treatment process to the top surface of the bottom electrode via, wherein the top surface of the bottom electrode via is concave after the performing of the surface treatment process.

19. The method of claim 17, wherein the bottom electrode via includes a conformal barrier layer and a filling metal.

20. The method of claim 17, wherein the bottom electrode includes a bottom layer interfacing the bottom electrode via and a top layer over the bottom layer, the bottom layer and the top layer include different material compositions, and a top surface of the bottom layer has a concave profile.

* * * * *